(12) United States Patent  
Dickey et al.

(10) Patent No.: US 7,923,068 B2
(45) Date of Patent: Apr. 12, 2011

(54) FABRICATION OF COMPOSITE MATERIALS USING ATOMIC LAYER DEPOSITION

(75) Inventors: Eric R. Dickey, Portland, OR (US); William A. Barrow, Beaverton, OR (US)

(73) Assignee: Lotus Applied Technology, LLC, Beaverton, OR (US)

( * ) Notice: Subject to any disclaimer, the term of this patent is extended or adjusted under 35 U.S.C. 154(b) by 282 days.

(21) Appl. No.: 12/030,044

(22) Filed: Feb. 12, 2008

(65) Prior Publication Data

US 2008/0193739 A1    Aug. 14, 2008

Related U.S. Application Data

(60) Provisional application No. 60/889,492, filed on Feb. 12, 2007.

(51) Int. Cl.
*B32B 5/22* (2006.01)
*C23F 1/00* (2006.01)
(52) U.S. Cl. .................. 427/248.1; 428/317.9; 428/615
(58) Field of Classification Search .................. None
See application file for complete search history.

(56) References Cited

U.S. PATENT DOCUMENTS

| | | | |
|---|---|---|---|
| 2,356,513 | A | 8/1944 | Gonon |
| 3,855,638 | A | 12/1974 | Pilliar |
| 4,058,430 | A | 11/1977 | Suntola et al. |
| 4,556,389 | A | 12/1985 | Ueno et al. |
| 4,652,459 | A | 3/1987 | Engelhardt |
| 4,960,646 | A | 10/1990 | Shimamune et al. |
| 5,076,980 | A | 12/1991 | Nogues et al. |
| 5,082,536 | A | 1/1992 | Izaki et al. |
| 5,178,901 | A | 1/1993 | Toriyama et al. |
| 5,232,570 | A | 8/1993 | Haines et al. |
| 5,650,197 | A | 7/1997 | Halpern |
| 5,837,331 | A | 11/1998 | Menu et al. |
| 5,853,561 | A | 12/1998 | Banks |
| 5,952,110 | A | 9/1999 | Schell et al. |
| 6,204,971 | B1 | 3/2001 | Morris et al. |
| 6,207,487 | B1 | 3/2001 | Kim et al. |
| 6,261,322 | B1 | 7/2001 | Despres, III et al. |
| 6,492,014 | B1 | 12/2002 | Rolison et al. |
| 6,596,375 | B2 | 7/2003 | Murata et al. |
| 6,749,945 | B2 | 6/2004 | Knobbe et al. |

(Continued)

FOREIGN PATENT DOCUMENTS

KR    1020040107536    12/2004

(Continued)

OTHER PUBLICATIONS

International Search Report and Written Opinion, PCT/US2008/053579, Jun. 9, 2008.

(Continued)

*Primary Examiner* — Timothy H Meeks
*Assistant Examiner* — Joseph Miller, Jr.
(74) *Attorney, Agent, or Firm* — Stoel Rives LLP

(57) ABSTRACT

Methods of constructing composite films including particles embedded in a filler matrix involve preparing a collection of stacked particles, then depositing a matrix material throughout the particle collection using an atomic layer deposition (ALD) method so as to substantially completely fill the spaces between the particles with the matrix material. During matrix deposition, a vapor phase etch cycle may be periodically employed to avoid clogging of small pores in the particle collection. New composite materials formed by such methods are also disclosed.

11 Claims, 12 Drawing Sheets

U.S. PATENT DOCUMENTS

| | | | |
|---|---|---|---|
| 6,787,199 | B2 | 9/2004 | Anpo et al. |
| 6,999,669 | B2 | 2/2006 | Summers et al. |
| 7,141,095 | B2 | 11/2006 | Aitchison et al. |
| 7,253,104 | B2 | 8/2007 | Derderian et al. |
| 2001/0034123 | A1* | 10/2001 | Jeon et al. ............. 438/643 |
| 2002/0119662 | A1* | 8/2002 | Kobayashi ............. 438/692 |
| 2004/0068323 | A1 | 4/2004 | Christensen |
| 2004/0224087 | A1 | 11/2004 | Weimer et al. |
| 2005/0031876 | A1 | 2/2005 | Lu et al. |
| 2005/0118449 | A1* | 6/2005 | Derderian et al. ......... 428/615 |
| 2005/0161120 | A1 | 7/2005 | Inagaki et al. |
| 2005/0221072 | A1 | 10/2005 | Dubrow et al. |
| 2005/0224779 | A1* | 10/2005 | Wang et al. ............. 257/9 |
| 2006/0151803 | A1 | 7/2006 | Wesner et al. |
| 2008/0160193 | A1 | 7/2008 | Mitchell |

FOREIGN PATENT DOCUMENTS

| | | |
|---|---|---|
| WO | WO 02/076631 A2 | 10/2002 |
| WO | WO 2005/0258353 A1 | 3/2005 |

OTHER PUBLICATIONS

Kukli, Kaupo et al., Atomic Layer Deposition of Tantalum Oxide Thin Films from Iodide Precursor, Chem. Mater. 2001, v. 13, pp. 122-128, ACS, abstract only.

Snyder, Mark Q., Modification of Semi-Metal Oxide and Metal Oxide Powders by Atomic Layer Deposition of Thin Films, University of Maine, May 2007, 119 pages.

Haukka, Suvi, ALD Technology—Present and Future Challenges, ECS Transactions, 2007, v. 3(15), pp. 15-26, The Electrochemical Society.

Buechler, Karen, et al, Atomic Layer Deposition, an Enabling Coating Technology for the Nanotechnology Future, ALD NanoSolutions, Inc., Feb. 2004, http://www.aldnanosolutions.com/wp-content/uploads/2009/12/ALD_Technology_White_Paper.pdf, 5 pages.

Wikipedia, Adsorption, http://en.wikipedia.org/wiki/Adsorption, downloaded Oct. 18, 2010, 11 pages.

Elam, Jeffrey W. et al., Atomic Layer Deposition for the Conformal Coating of Nanoporous Materials, Journal of Nanomaterials, vol. 2006, Article ID 64501, May 2006, pp. 1-5.

Graugnard, E. et al., Atomic Layer Deposition for Photonic Crystal Devices, Georgia Institute of Technology, Aug. 16, 2004, 23 pages.

Graugnard, E. et al., Atomic Layer Deposition for Precise, Large-Scale Nanostructure Fabrication, Georgia Institute of Technology, Nov. 10, 2004, 31 pages.

Graugnard, E. et al., Photonic Band Tuning in Two-Dimensional Phonotic Crystal Slab Waveguides by Atomic Layer Deposition, Applied Physics Letters, v. 89, 181108, Oct. 31, 2006, 3 pages.

Graugnard, Elton et al., Sacrificial-Layer Atomic Layer Deposition for Fabrication of Non-Close-Packed Inverse-Opal Photonic Crystals, Advanced Functional Materials, v. 16, 2006, pp. 1187-1196.

King, J. S. et al., High-filling-fraction Inverted ZnS Opals Fabricated by Atomic Layer Deposition, Applied Physics Letters, vol. 83, No. 13, Sep. 29, 2003, pp. 2566-2568.

King, J. S. et al., Atomic Layer Deposition in Porous Structures: 3D Photonic Crystals, Applied Surface Science, v. 244, Jan. 19, 2005, pp. 511-516.

King, Jeffrey S. et al., Conformally Back-Filled, Non-close-packed Inverse-Opal Photonic Crystals, Advanced Materials, v. 18, Mar. 22, 2006, pp. 1063-1067.

King, Jeffrey S. et al., Infiltration and Inversion of Holographically Defined Polymer Photonic Crystal Templates by Atomic Layer Deposition, Advanced Materials, v. 18, May 18, 2006, pp. 1561-1565.

Ritala, Mikko et al., Atomic Layer Epitaxy—a Valuable Tool for Nanotechnology?, Nanotechnology 10, 1999, pp. 19-24.

Rugge, Alessandro et al., Tungsten Nitride Inverse Opals by Atomic Layer Deposition, Nano Letters, 2003, vol. 3, No. 9, Jul. 31, 2003, pp. 1293-1297.

Sneh, Ofer et al., Using Atomic Layer Deposition to Engineer Composite High-K Dielectric Films for Optimal Performance in Next Generations Semiconductor Devices, ICMI 2001 proceedings, 4 pages.

* cited by examiner

FABRICATION OF COMPOSITE MATERIALS USING ATOMIC LAYER DEPOSITION

RELATED APPLICATIONS

This application claims priority to U.S. Provisional Application No. 60/889,492 filed on Feb. 12, 2007, which is hereby incorporated by reference in its entirety.

TECHNICAL FIELD

This field of this disclosure relates generally to composite materials and thin-film composites, and to methods of making such composites.

BACKGROUND

Composite materials allow significantly more opportunity to engineer material properties than do homogeneous materials. Composite thin films can be built by laminating stacks of films, depositing films that are mixtures or metal alloys, or incorporating pieces of one material in a continuum of a second material. The present inventors have identified a need for composite thin films comprised of particles embedded in a filler matrix, in which the choice of materials for each component—particles and filler—dictates unique properties of the composite film that are not provided by the particles or the filler alone.

Some composite materials are made by embedding reinforcing particles, fibers, or fabric in a liquid polymer matrix that is cured in and around a reinforcing material. Fiberglass and carbon fiber reinforced plastics are examples, but these are not typically made into thin films.

In another known method, a thin film matrix is first formed, typically on a substrate, and then implanted with particles by pressing or rolling the particles into the surface of the matrix. However, the depth and density of the implanted particles in such materials may be limited, particularly for particles that are soft relative to the matrix and for particles that are very small. Particles implanted in this manner may also be easily dislodged or washed away due to weak mechanical retention.

Still another known process wherein particles are embedded in a matrix of a second material involves a sol-gel reaction. In a conventional sol-gel process for forming a monolithic film, a precursor solution is subjected to a series of hydrolysis and polymerization reactions to form a colloidal suspension that is coated onto a substrate. Particles in the colloidal suspension then condense in a new phase, a gel, in which a solid macromolecule is immersed in volatile solvent. The gel is dried to remove the solvent, resulting in a highly porous xerogel that is then densified by sintering and/or alternative heat treatment to form a monolithic glass or ceramic film. U.S. Pat. No. 5,076,980 of Nogues et al. describes a similar process for making sol-gel monoliths. Others have proposed mixing particles of a second material into the sol-gel matrix to form a composite material.

For example, U.S. Pat. No. 6,492,014 of Rolison et al. describes mixing guest particles in a mesoporous gel matrix formed by sol-gel reaction to create a composite material that is then dried. U.S. Pat. No. 6,749,945 of Knobbe et al. describes entrapping particles of alumina ($Al_2O_3$) or titania ($TiO_2$) larger than 1 micron in a matrix of organically modified silicate (Ormosil) formed by sol-gel reaction to achieve a thin-film composite. Sol-gel composites, however, have certain disadvantages. Possible component materials are limited to those that can withstand processing at high-temperatures. Particle sizes may be limited to those that can be held in a colloidal suspension. Furthermore, composites made using the sol-gel process exhibit poor particle-to-filler bonding, high porosity, and they are relatively soft materials.

U.S. Pat. No. 6,999,669 of Summers et al. describes using atomic layer deposition (ALD) to manufacture photonic crystals comprised of a phosphor matrix and a plurality of defect regions. The matrix is formed by infiltrating interstices in a defect-laden synthetic opal with zinc sulfide (ZnS), gallium phosphate (GaP), alumina ($Al_2O_3$), titania ($TiO_2$), or another material using ALD, then chemically removing the synthetic opal, leaving behind a honeycomb-like structure comprising only the matrix and the defect structures. See also, J. S. King et al., "Atomic Layer Deposition in Porous Structures: 3D Photonic Crystals," J. Applied Surface Science v. 244, pp. 511-516 (2005); and Jeffrey S. King et al., "Conformally Back-filled, Non-close-packed Inverse-Opal Photonic Crystals," Advanced Materials v. 18, pp. 1063-1067 (2006). Summers '669 indicates that ALD was chosen for its ability to produce high quality films with low porosity and good optical qualities.

The present inventors have identified a need for improved thin film composite materials.

SUMMARY

The present disclosure proposes new methods of constructing composite films comprised of particles embedded in a filler matrix. The methods enable commercial manufacture of composite materials previously not possible. In accordance with an embodiment of these new methods, a collection of stacked particles is initially provided, for example, by assembling a film of particles on a substrate. Then a matrix material is deposited throughout the particle collection so as to substantially fill spaces between the particles with the matrix material.

Particles may be collected together in various ways. For example, particles may be poured into a mold, poured onto a solid or liquid surface or, if mixed with a binder, they can be coated onto a surface and then fired to remove the binder prior to depositing the filler matrix. The surface supporting the collection of particles may be flat, or it may be an irregular three-dimensional surface. In some embodiments, particles may be applied to a substrate electrostatically or magnetically, or they may be suspended and held together by electromagnetic forces.

Individual particles may be spherical, oblong, geometrical, or irregularly shaped. Particles are preferably clustered, densely stacked, packed, or agglomerated, forming a coating having a thickness significantly greater than the mean particle size, typically 0.1-5 microns (μm), and preferably greater than the largest particle size. Depending on the application the particles may be selected for certain properties such as magnetism or hardness.

The collection of particles, or cluster, may define relatively small interstitial spaces within the cluster, particularly in tightly stacked or packed collections of regularly-shaped particles. In addition, the cluster may also include agglomerates of particles and may exhibit relatively large gaps between particle agglomerates. Pores leading to interstitial spaces and inter-agglomerate spaces will often be smaller in diameter than the spaces themselves. In some embodiments, interstitial spaces are irregular and exhibit a high degree of tortuosity, for instance, when the particle shapes resemble flakes. Some embodiments include fibrous particles, such as carbon fibers or carbon nanotubes, in which case the thickness of the thin-film composite is preferably significantly thicker than the thickness of the largest fibers. Fibrous particles may also be stacked or packed to form a three-dimensional arrangement.

Filler matrix materials suitable for embedding particles in a thin film by the techniques described herein include metals, dielectrics, or other inorganic materials. Certain organic materials such as carbides can also serve as a filler material.

In one embodiment, the filler matrix deposition process involves the atomic layer deposition (ALD) method. ALD generally involves deposition of thin films through sequential, self-limiting surface reactions in which alternating pulses of two or more reactant precursor gases into a reaction space are separated by purge cycles that remove excess precursor from the reaction space. Each purge cycle normally involves flushing the reaction space with an inert gas, while leaving behind an adsorbed layer of the preceding precursor for reaction with the next precursor introduced. ALD has advantages over many other deposition techniques in that ALD can accommodate a wide range of process chemistries, pressures, and temperatures under which highly conformal, pinhole-free films can be formed. Unlike certain other deposition methods, some ALD films can be deposited at room temperature. The ALD process, which is sometimes referred to as Atomic Layer Epitaxy (ALE), is further described in U.S. Pat. No. 4,058,430 of Suntola et al., incorporated herein by reference.

The ALD matrix deposition method for forming a composite material begins by exposing the collection of particles to a first precursor chemical for a time sufficient to allow the first precursor to infiltrate the spaces between particles and to adsorb to surfaces of the particles throughout the collection. Excess amounts of the non-adsorbed first precursor are then removed from the space beyond the collection of particles. In some embodiments both adsorbed and residual non-adsorbed portions of the first precursor remain within the inter-particulate spaces after the excess amounts of the first precursor are removed. In one embodiment, the excess first precursor is removed by an inert gas purge having a duration sufficient to remove excess precursor from the space around the collection of particles, but short enough to avoid removing all of the residual non-adsorbed first precursor from the interstices. A second precursor chemical is then introduced and allowed to infiltrate the inter-particulate spaces where the second precursor reacts with the adsorbed residual first precursor to form a deposit of filler material on the surfaces of the particles. In embodiments wherein residual non-adsorbed first precursor remains within inter-particulate spaces, the second precursor also reacts with the non-absorbed first precursor to form additional filler material within the inter-particulate spaces. Reaction byproducts and excess amounts of the second precursor are then removed, either partially (so as to leave residual in the inter-particulate spaces) or substantially completely, and the steps of introducing the first precursor, removing excess, introducing the second precursor, and removing excess and byproducts, are then repeated until sufficient amounts of the filler matrix material have been deposited. In some embodiments, more than two precursors may be used.

Leaving residual non-adsorbed amounts of precursor in the interstices between pulses, as is done in some embodiments, may give rise to a kind of localized quasi-chemical vapor deposition reaction (hereinafter "quasi-CVD") that is believed to initially deposit a greater amount of the filler matrix material deep within the collection of particles than at the outer surface of the collection. A series of localized quasi-CVD reactions may result in substantially complete filling of the inter-particulate spaces with the matrix material before the pores leading to the spaces are sealed by buildup of ALD-deposited layers. In some embodiments, the filler matrix deposition method may include periodic etch cycles, in which the partially formed composite is exposed to an etchant. The etchant removes at least a portion of the matrix material preferentially from the outer surface of the collection of particles and from pores near the surface to prevent such pores from clogging. In some embodiments, one or more of the precursor chemicals may be "self-etching" such that etching can be accomplished by increasing the exposure time or concentration of the relevant precursor chemicals.

In an alternative embodiment, the deposition process parameters may be selected to intentionally leave voids within the composite by allowing pores to be plugged before the inter-particulate spaces are completely filled. Void sizes may be controlled through control of deposition and/or etch process parameters.

Additional aspects and advantages will be apparent from the following detailed description of preferred embodiments, which proceeds with reference to the accompanying drawings.

DETAILED DESCRIPTION OF PREFERRED EMBODIMENTS

Throughout the specification, reference to "one embodiment," or "an embodiment," or "some embodiments" means that a particular described feature, structure, or characteristic is included in at least one embodiment. Thus appearances of the phrases "in one embodiment," "in an embodiment," "in some embodiments," and the like, in various places throughout this specification are not necessarily all referring to the same embodiment. Furthermore, the described features, structures, or characteristics may be combined in any suitable manner in one or more embodiments. In some cases, the invention may be practiced without one or more of the specific details or with other methods, components, materials, etc. In other instances, well-known structures, materials, or operations are not shown or not described in detail to avoid obscuring aspects of the embodiments.

Figure 1:
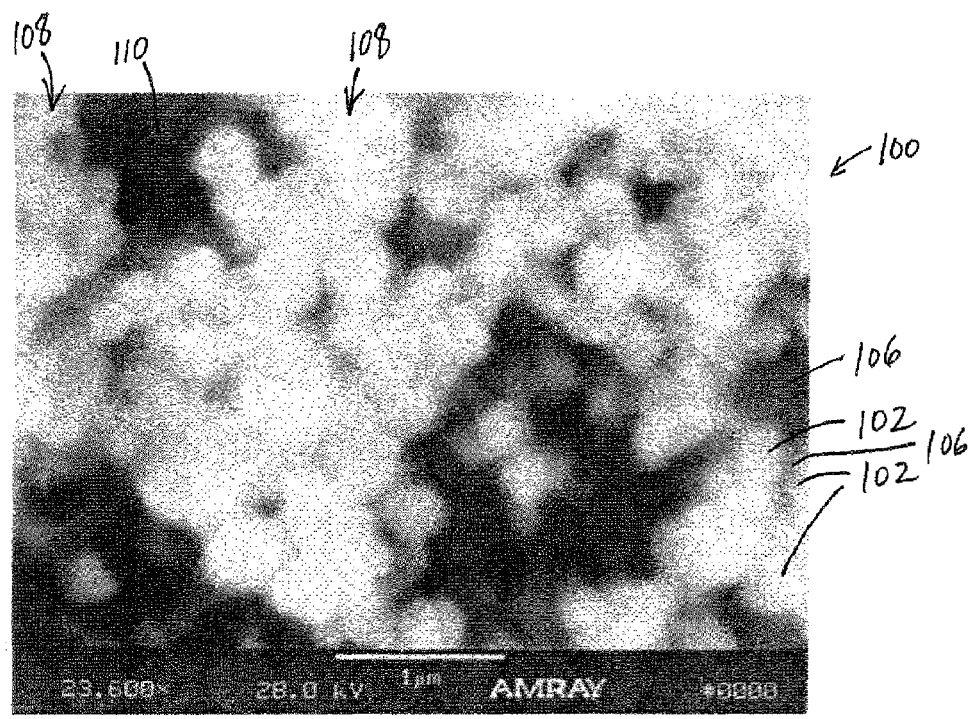
FIG. 1 is a scanning electron micrograph showing a top view of a stack of titanium dioxide particles (without matrix material)
Figure 2:
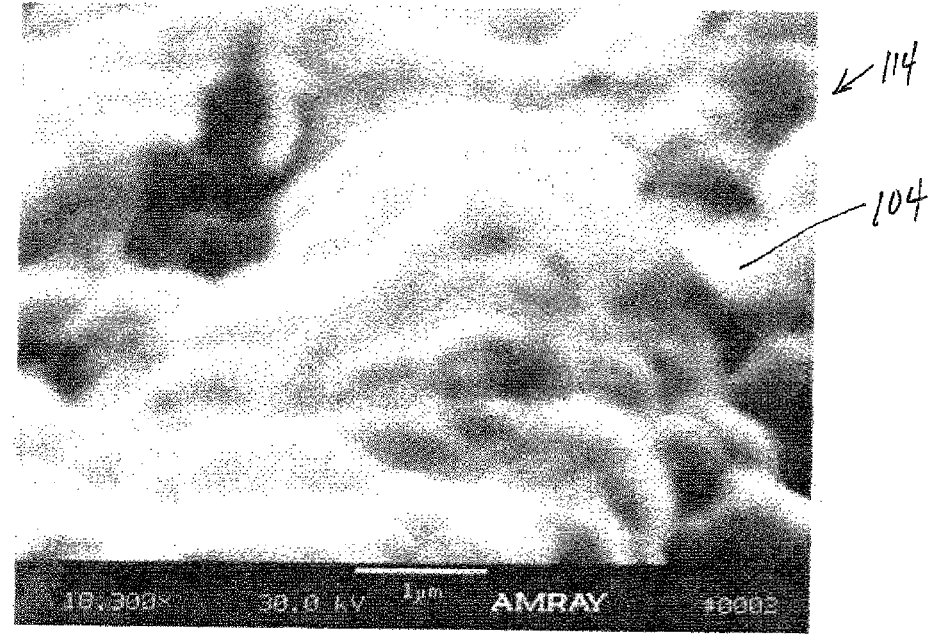
FIG. 2 is a scanning electron micrograph showing a top view of a finished composite material with matrix material deposited into the particle stack of FIG. 1.
Figure 3:
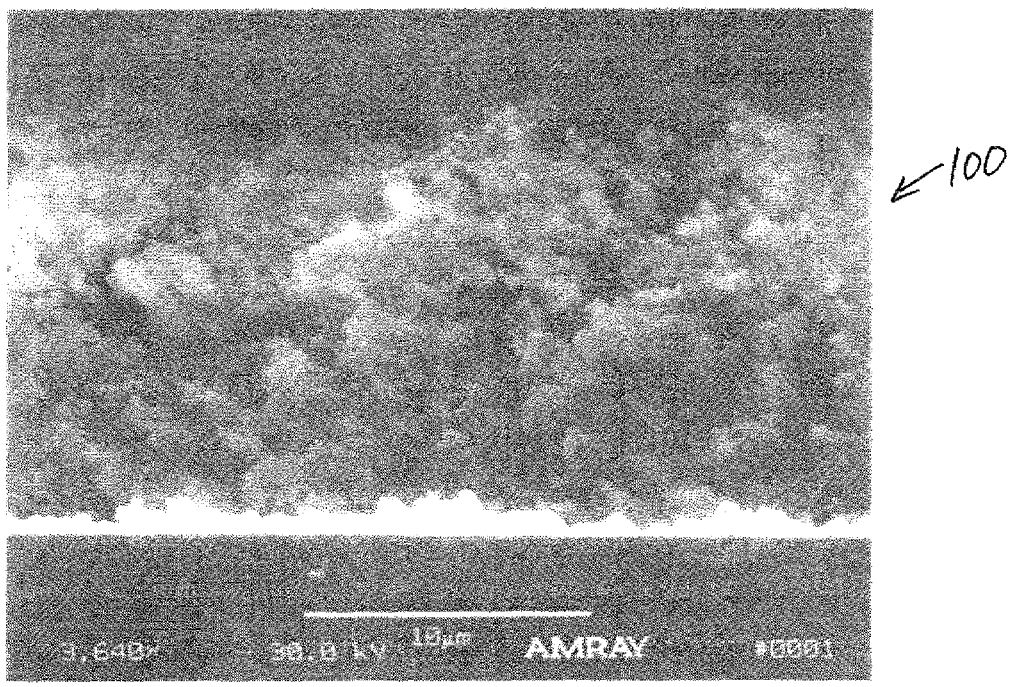
FIG. 3 is a scanning electron micrograph of a cleaved side of the particle stack of FIG. 1, shown at lower magnification than FIG. 1.
Figure 4:
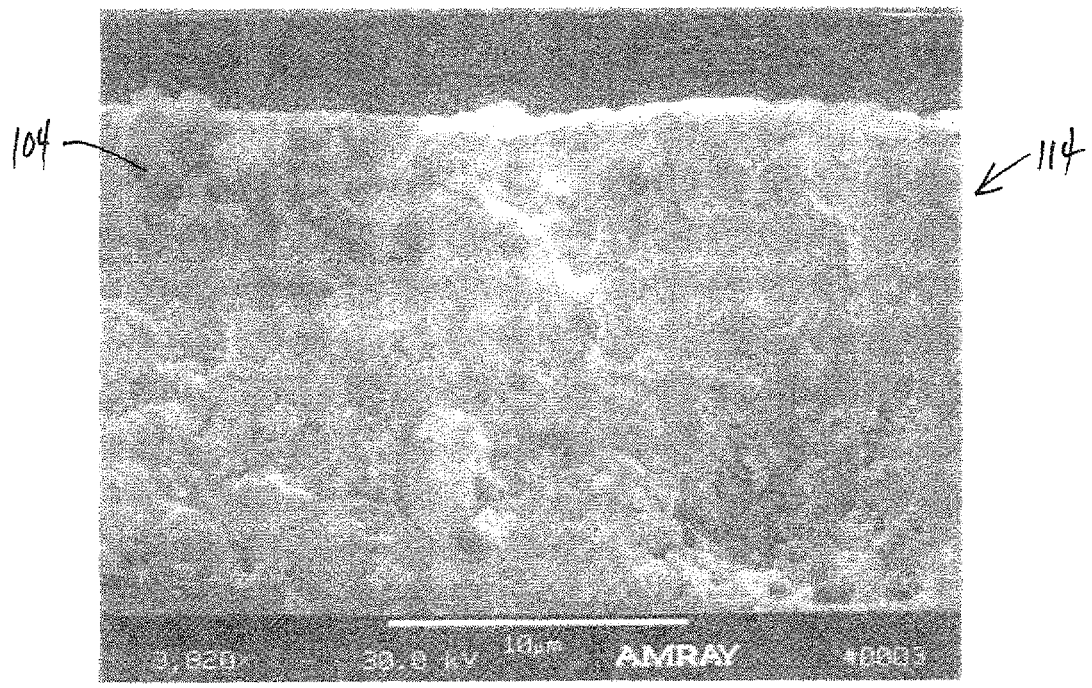
FIG. 4 is a scanning electron micrograph of a cleaved side of the finished composite of FIG. 2, shown at lower magnification than FIG. 2.

FIGS. 1 and 3 are scanning electron microscope (SEM) micrographs illustrating respective top and side views of clustered particles on a substrate prior to deposition of a matrix material (the magnification of FIG. 1 is several times greater than FIG. 3, as indicated in the legend at the bottom of the micrographs). FIGS. 2 and 4 are SEM micrographs illustrating finished composite films in respective top and side views corresponding to those of respective FIGS. 1 and 3. FIGS. 1 and 2 are top views of the outer surface of the particle collection and finished composite film, respectively, from an angle of view of approximately 45 degrees; and FIGS. 3 and 4 are side elevation views at lower magnification of cleaved sections of the respective particles and finished composite film. The overall thickness of the particle stack and finished composite film of this example is in the range of about 17 micrometers (μm).

FIGS. 1-4 illustrate one example of a composite thin film made according to methods disclosed herein, comprising a stack 100 of $TiO_2$ particles 102 in the range of about 200 nm (nanometers) to 300 nm in diameter and $Al_2O_3$ filler matrix 104 (FIGS. 2 and 4). As shown in FIGS. 1 and 3, the particles 102 are stacked randomly, with some clumping or aggregation of groups of particles. The particle stack is highly porous and, where tightly packed, defines interstitial spaces 106 between the particles. As best seen in FIG. 1, groups of particles may form agglomerates 108 that stack like microscale particles, instead of like the nano-scale particles from which the aggregates are formed, leaving some relatively large inter-agglomerate spaces 110 within the stack 100 between agglomerates 108. As best illustrated in FIG. 4, the particle collection is infiltrated with $Al_2O_3$ matrix material 104 so completely that the inter-particulate spaces 106, 110 are substantially completely filled with the matrix material including both the interstitial spaces and inter-agglomerate spaces. The filling is so complete that the particles cannot readily be distinguished from the matrix in the finished composite material 114 of FIG. 4.

Figure 5:
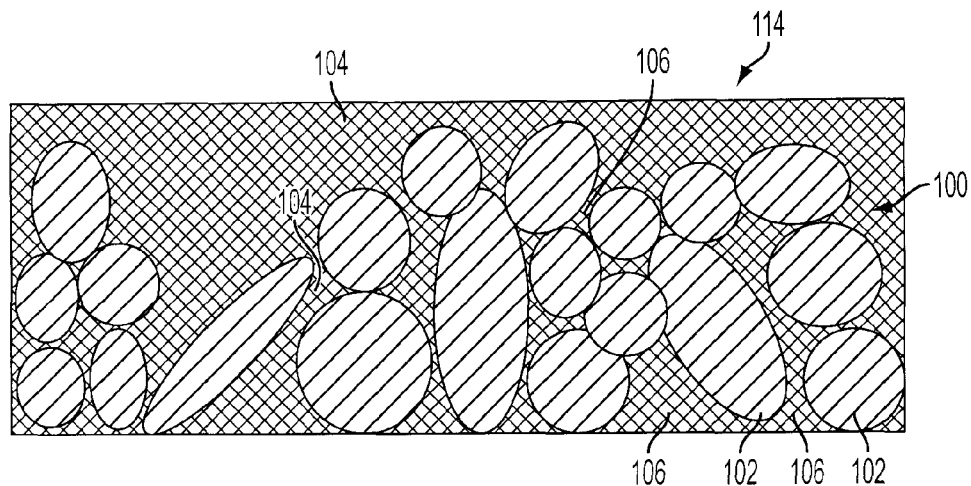
FIG. 5 is a simplified sectional side view drawing of a finished composite material showing a stack of particles embedded in a matrix filler material that has completely filled the interstitial spaces between the particles without leaving voids.

FIG. 5 is a simplified sectional view of the composite 114 of FIGS. 1-4, illustrating stack 100 of particles 102 and filler matrix 104, more clearly than the SEM micrographs of FIGS. 1-4. The illustration of FIG. 5 is greatly simplified, in that the thickness of the stack is limited to just slightly greater than the size of the largest particles in the stack. FIG. 5 illustrates the stack 100 defining interstitial spaces 106 between packed particles 102, but omits the agglomerates and inter-agglomerate spaces of FIGS. 1-4 due to the scale of the illustration.

Figure 6:
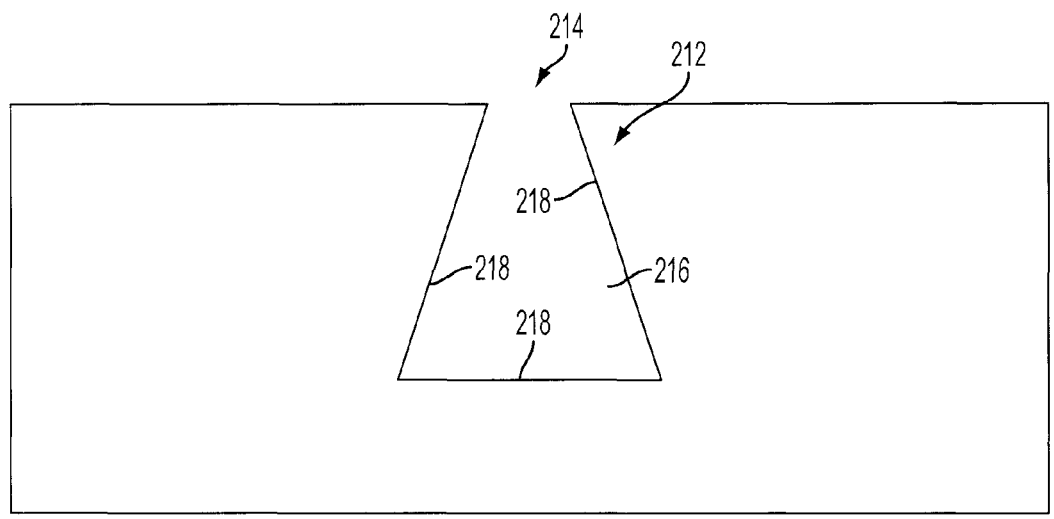
FIG. 6 is a drawing of a retrograde cavity in a substrate as a simplified model of an inter-particulate space of the particle stack of FIG. 5.

For purposes of illustrating the deposition method of the present disclosure, inter-particulate spaces 106, 110 can be illustrated as retrograde cavities. For simplicity, a single such model cavity 212 is illustrated in cross section in FIGS. 6-12. With reference to FIG. 6, cavity 212 has an entrance pore 214 (hereinafter "entrance") that is significantly smaller than the diameter of a chamber or "interior volume" 216 beyond the pore 214. Note, however, that the actual size and shape of inter-particulate spaces may vary widely within a single collection of particles, and may depend on the particles used and the method of their application. Inter-particulate spaces may be highly tortuous and may have diameters that increase and decrease along their length, such that multiple "necks" are present between the pore and the deepest part of a cavity. Micro-cavities and inter-agglomerate spaces may have volumes that span a wide range, potentially many times greater than the volumes of nano-scale interstitial spaces (i.e., chambers between necks) present within closely packed portions of the particle collection. In other embodiments, inter-particulate spaces may be made highly uniform in size and spacing within a particle stack through the arrangement of uniformly sized particles into a closely-stacked array.

Particles may range in size from just a few nanometers across to hundreds of microns across, and may be mixed in sizes and shapes. For example, composite materials having desirable mechanical and optical properties may be formed using particles having an average diameter in the range of 0.1 to 5.0 microns (μm). Inter-particulate spaces may range in size from nanometers across to hundreds of microns (although such large spaces may take a prohibitively long time to fill using the modified ALD methods disclosed herein).

In one embodiment an embedding process may intentionally leave voids between particles. For example, an ALD process may permit a first precursor to infiltrate the inter-particulate spaces in a collection of particles. The first precursor adsorbs to the particle surfaces before a purge process begins. The purge may remove the non-adsorbed first precursor from the collection of particles. In other embodiments, some non-adsorbed first precursor may remain in the collection of particles.

After the non-adsorbed first precursor is removed, a second precursor infiltrates the inter-particulate spaces and reacts with the adsorbed first precursor to create a layer of filler material on the particle surfaces. Reaction byproducts and un-reacted second precursor are then removed by another purge process. In other embodiments, some un-reacted second precursor and/or reaction byproducts may remain within the collection of particles.

The embedding process continues by repeating the steps of infiltrating the first precursor, purging non-adsorbed first precursor, infiltrating the second precursor, and purging un-reacted second precursor to build an increasingly thick layer of filler material on the particle surfaces. Some embodiments include one or more etch processes to remove some of the filler material, preferably from the outer surface of the collection of particles and/or from pores near the surface. Including one or more etch processes may permit the filler material to build-up more in the interior of the collection of particles as a material is created.

Figure 7:
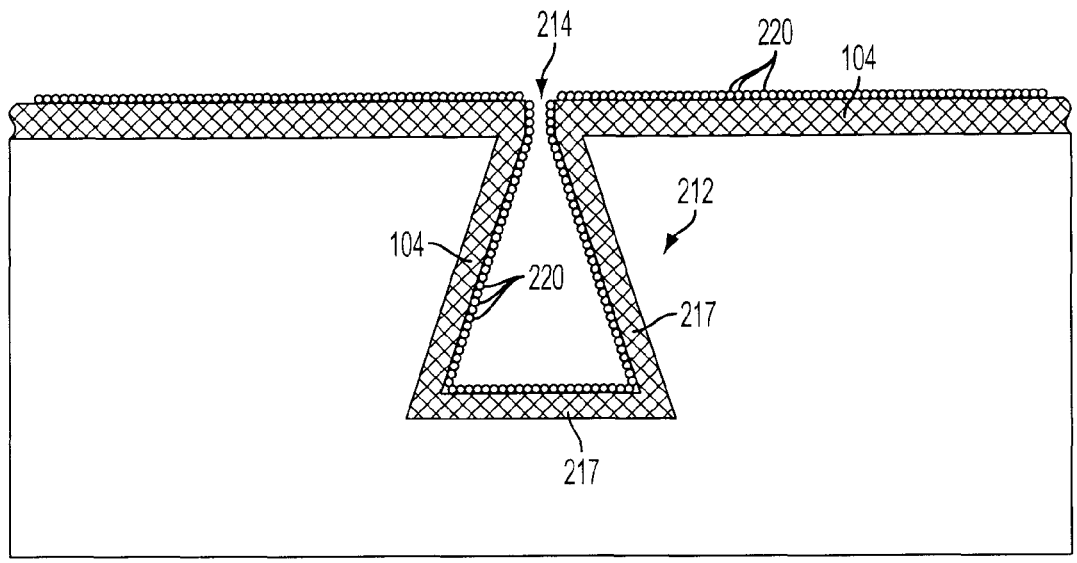
FIG. 7 is a sectional side view of the retrograde cavity of FIG. 6 with a uniform thin film coating and residual precursor adsorbed to all surfaces.
Figure 8:
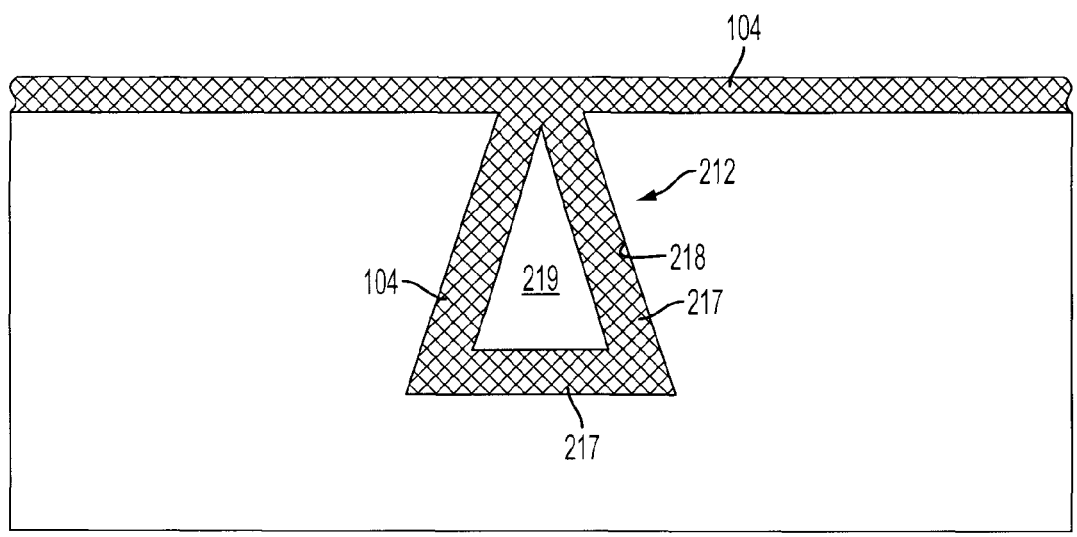
FIG. 8 is a projection of true-ALD type growth within a retrograde cavity, resulting in plugging of the cavity opening.

The embedding process ends when a desired material is achieved. For example, a material having random, or non-random, voids may be desired for optical or electrical purposes, or may provide sufficient mechanical bonding between the particles for an intended use, or may entrap a particular material, such as a gas, within the collection of particles. One embodiment where a void is intentionally left is depicted in FIGS. 7 and 8 where pore 214 is sealed by filler material 104 leaving void 219 in cavity 212.

The following detailed description of an embedding process refers to FIGS. 6-12, and particularly FIGS. 9-12, which illustrate a technique for filling irregularly shaped cavities with matrix material. The fill technique may involve inside-out deposition of matrix material within each cavity 212 encountered along a tortuous path through a powder or stack of other particles.

The method depicted in FIGS. 9-12, as well as the one depicted in FIGS. 13-23 can be distinguished from conventional ALD and CVD processes, which alone may not effectively fill the cavity 212 because either process would seal off the entrance 214 prior to completely filling the interior volume 216. For example, FIGS. 7 and 8 depict an embodiment using conventional ALD processes for conformal growth which are surface limited. Therefore, the same thickness of film 217 grows on all surfaces with each deposition cycle (as illustrated by the newly-deposited layer of molecules shown in FIG. 7, shown in exaggerated size for clarity). The conformal deposition of ALD leads to complete blockage of the inlet entrance 214 when the thickness on interior walls 218 increases to the radius of the opening. Early sealing of the pore 214 in a retrograde cavity leaves a void 219 (FIG. 8) within the cavity 212. Similarly, a CVD process alone would lead to an even higher growth rate at the inlet 214 compared to the interior surfaces 218 of the cavity, because of the dependence on precursor availability at points on the surface. Using conventional CVD would result in a greater amount of precursor being available for reaction outside of the cavity 212 and in the pore 214, than in the interior volume 216.

According to other embodiments of filling methods, a modified ALD method for inside-out deposition combines localized elements of both CVD and ALD growth, with growth on exterior surfaces 220 of the particle stack being substantially from ALD, and growth on interior surfaces 218 combining aspects of both ALD and CVD modes. Growth rates may be adjusted by modifying purge times and precursor pulse strengths in the pulse/purge sequence.

Suitable ALD reactors for performing the disclosed methods and for making composite materials consistent with this disclosure are described in U.S. Pat. Nos. 4,389,973 and 4,413,022, which are incorporated herein by reference. Improved precursor delivery systems and ALD reactors useful for performing some of the processes described herein are disclosed in U.S. Pat. No. 7,141,095, which is also incorporated herein by reference. For example, an ALD reactor for performing the processes of various embodiments may include a reaction chamber defining a reaction space in which is placed one or more particle-laden substrates, a first precursor source system for delivering to the reaction space a first precursor, a second precursor source system for delivering to the reaction space a second precursor, an inert gas flow system, a heating system for heating the substrate, a pumping system, and a control system operatively coupled to the first and second source systems for controlling the delivery of the chemicals into the reaction space. ALD systems of this kind are known as traveling wave reactors.

In other embodiments, an alternative enclosure could function as a reaction chamber or reaction space. For instance, lining a pipe with a composite material can be accomplished by directly depositing a film onto the interior walls of the pipe, in which case the pipe itself serves as the reaction chamber. In another embodiment, the deposition method described herein may be performed using a multi-chamber traveling substrate device, in which a substrate travels through a sequence of process chambers linked by slit valves. Instead of pulsing and purging into a common reaction space, the precursor gases and purge gases are present in the process chambers, typically under steady-flow conditions. In such a system, the substrate would typically need to make many hundreds of passes through the process chambers or a single pass through many hundreds of process chambers to achieve desired thickness of deposited films. In a traveling-substrate process, the ALD process parameters are determined by the speed of substrate travel through the process chambers and the size of the process chambers. Such a system is described in U.S. Provisional Application No. 60/743,786, filed Mar. 26, 2006, and in related U.S. patent application Ser. No. 11/691,421, filed Mar. 26, 2007, both titled "Atomic Layer Deposition System and Method for Coating Flexible Substrates. Both Application No. 60/743,786 and application Ser. No. 11/691,421 are incorporated herein by reference.

Figure 9:
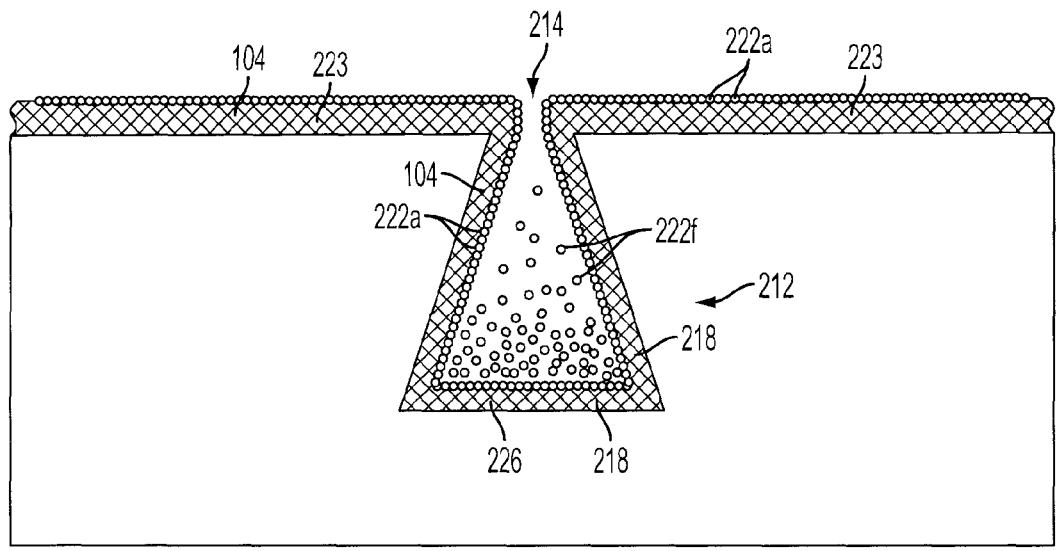
FIG. 9 is a sectional side view of the cavity of FIG. 6 showing adsorbed precursor on all surfaces and residual non-adsorbed precursor within the cavity.
Figure 10:
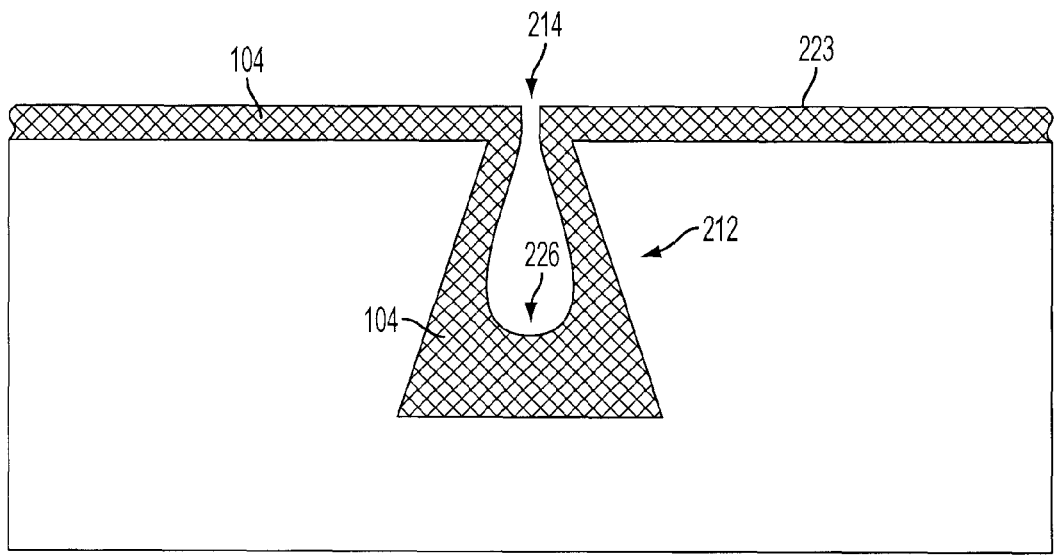
FIG. 10 is a sectional side view of the retrograde cavity of FIG. 9 following subsequent film deposition cycles, showing non-uniform deposition onto interior surfaces resulting in a thicker layer of matrix material being deposited toward the bottom of the cavity.

FIGS. 9-10 illustrate one embodiment of a process for modified ALD, in this case, depositing hafnium oxide ($HfO_2$) from hafnium tert-butoxide ($Hf[OC(CH_3)_3]_4$) and water precursors, in a four-part growth cycle. The first phase involves saturating all surfaces of the substrate with water vapor and then purging excess vapor to leave behind water molecules 222a adsorbed to the surface. Whereas a traditional ALD process would involve a complete purge, leaving behind no water in the vapor phase (FIG. 7), the hybrid method of the present disclosure involves truncating the purge time to leave behind some free, non-adsorbed water molecules 222f in the vapor phase, in the deepest recesses of the interior volume 216, as illustrated in FIG. 9. Due to the flow dynamics of the pulse and shortened-purge cycles, the non-adsorbed water molecules 222f will tend to have a higher concentration deep within the interior volume 216 than near the inlet 214, as illustrated in FIG. 9. Next, a hafnium tert-butoxide precursor is introduced into the reaction chamber, reacting with the remaining water 222a, 222f to form hafnium oxide at the surfaces. A hafnium oxide film is formed in a self-limiting ALD-type reaction on interior surfaces 218 of the cavity 212, on exterior surfaces 223 outside of the cavity, at the inlet 214 of the cavity, while simultaneously being deposited in a quasi-CVD mode 224 within the cavity 212 at a higher growth rate, due to the availability of free water molecules 222f therein. By increasing the pulse time and decreasing the purge time, feature-dependent inside-out film growth is achieved. Excess hafnium tert-butoxide precursor and reaction byproducts are then purged from the space occupied by the substrate. The results of inside-out deposition according to the modified-ALD process described above are illustrated in FIG. 10, showing a thicker film buildup near the bottom 226 of the cavity 212 than at the inlet 214 and exterior surfaces 223.

Figure 11:
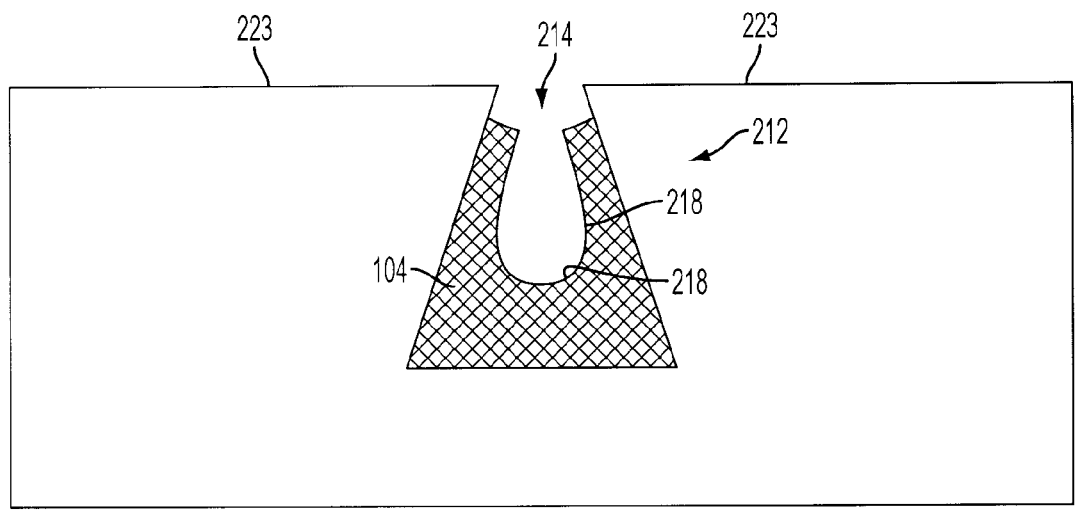
FIG. 11 is sectional side view of the retrograde cavity of FIG. 10 after exposure to a vapor etch which consumes ALD film preferentially from outside surfaces and from the cavity entrance.

Localized film accumulation at the bottom 226 of the cavity 212 can be enhanced by adding an etch step which preferentially removes material 225 from exterior surfaces 223 and at the inlet 214, as illustrated in FIG. 11. The net result of removing material preferentially from exterior surfaces and pores while depositing preferentially on interior surfaces with quasi-CVD effectively increases the inside-out deposition potential, particularly for deep and large inter-particulate spaces having relatively small pores leading to them, and thus aiding in the deposition of a dense composite material without voids even when the sizes and shapes of interstitial spaces and pores are not uniform throughout the particle stack.

In one embodiment of a deposition scheme involving an etch cycle, tantalum oxide ($Ta_2O_5$) is deposited by reacting $TaCl_5$ and water ($H_2O$) precursors. Self-etching can be induced during the ALD process by heating the substrate or increasing the $TaCl_5$ dose, producing zero net film growth at areas exposed to excess $TaCl_5$ for a sufficient time. The substrate temperature is increased prior to initiating a standard ALD sequence where $H_2O$ is introduced and purged, followed by $TaCl_5$ pulse and purge, during which the $TaCl_5$ dose is set at a high strength to incite etching preferentially the film 225 on exterior surfaces 223 and at the inlet 214. The $TaCl_5$ dose, even at the increased level, does not penetrate the cavity well enough to induce significant self-etching. After each etch cycle, the substrate temperature is ramped down and deposition resumes on exterior surfaces 223 as well. Periodic etching combined with the modified ALD method described above with reference to FIGS. 9-10 results in a high rate of deposition on the interior surfaces 218 while keeping the inlets (pores) 214 open.

Figure 12:
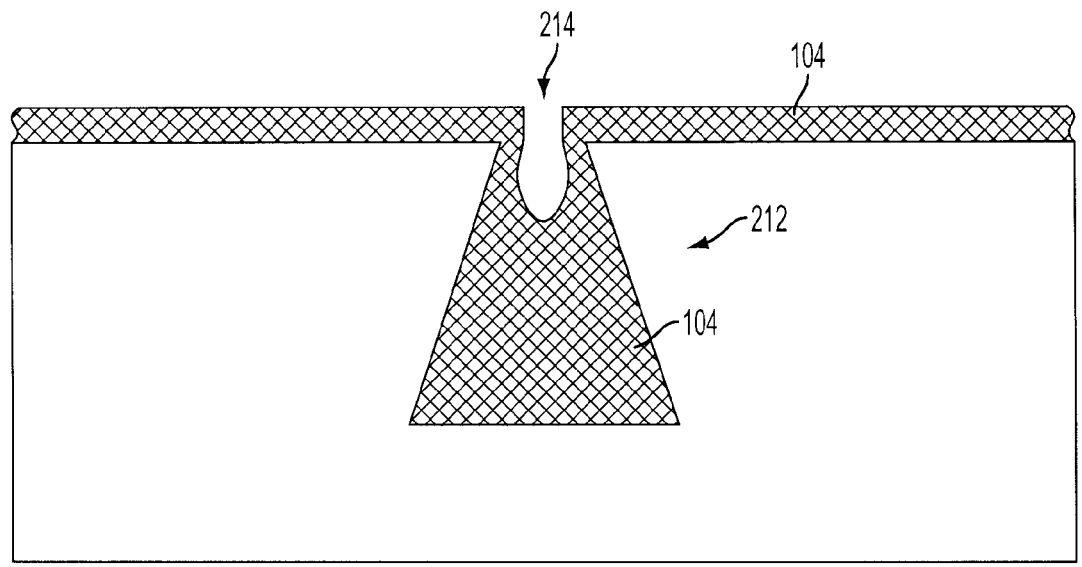
FIG. 12 is a projection of resulting inside-out growth following the vapor etch and a further cycles of ALD/quasi-CVD deposition.

In another embodiment using preferential etching, film growth on outer surfaces is consumed by pulsing a vapor phase etchant over the substrate (i.e. over the particle stack), the etchant otherwise being independent of, and not contributing to, the film growth process. For example, modified ALD deposition of $Nb_2O_5$ from a large dose of Niobium ethoxide or $NbCl_5$ and water can proceed to deposit into the deepest recesses of a cavity, followed by a pulse of a metal halide vapor that strips outer surfaces without penetrating the cavity to affect inner surfaces. By carefully adjusting the precursor dosage, the ratio of etching on outer surfaces to deposition on inner surfaces can be tuned. Other precursors that may be used in such an ALD etching/deposition scheme include $NbCl_5$, $SiCl_4$, $BBr_3$, and $WCl_6$. The same scheme can be used with a CVD process instead of an ALD process, although the quality of the resulting matrix material will not be as fine. Continued deposition and etching leads to continued inside-out deposition, as illustrated in FIG. 12. The method should preferably conclude with a number of true-ALD cycles (and without etching) to ensure a pinhole free shell over the composite.

Composite materials formed by the ALD processes described above may provide improved material properties. For example, properties such as electrical and thermal conductivity, optical properties such as refractive index, diffraction, interference, scattering, opacity, and color, chemical and corrosion resistance, catalytic effects, bioactivity, adhesion, mechanical strength, hardness, flexibility, roughness, and frictional coefficient may be tuned to suit a particular application or need. Composite materials containing magnetic particles, either hard, soft, or a combination of the two, could be created using the ALD processes described above to modify the magnetic or resistivity properties of the composite. Magnetic particles could be pre-aligned using an external magnetic force and held in a pre-aligned arrangement by the filler material to tune the magnetic field of the resulting composite. For example, such composites may provide benefits as radar absorbing coatings. Another example may be that soft magnetic particles sufficiently bound by a filler material may produce improved frequency response and efficiency in electronic devices. Additional advantages and benefits may be realized by using the above-described ALD processes to create composite materials having adjustable properties, including the exemplary properties described above as well as other properties.

When particles and filler matrix are the same kind of material, a relatively thick (e.g. 10-50 micron) homogeneous coating can be made, free of pinholes, which so far has been impractical to produce with conventional ALD processing. Composite materials may thus include materials made from the same kind of material. The particles and filler matrix materials may be inorganic or organic.

With reference to FIGS. 13-23, a hypothetical embodiment for creating a material using a modified ALD method for inside-out filler material deposition is described. FIGS. 13-23 are for illustrative purposes, and are not drawn to scale. The modified ALD method combines localized elements of both CVD and ALD growth as described above. While etching cycles are not described with respect to FIGS. 13-23, etching cycles may be included for some embodiments. Filler material build-up may occur at a higher rate within a collection of particles than near the surface of the collection of particles. Filler material build-up may also occur at a higher rate within inter-particulate spaces than on the surface of the particles. Filler material build-up may be adjusted by modifying precursor pulse times and purge times in the pulse/purge sequence.

Materials created by these embodiments may be composite materials where the particles have a different composition from the filler material and may also be materials where the particles have a similar, or identical composition, to the filler material. What particles and filler materials to use are dependent on the intended use for the material created. The amount of filler deposited, or built-up, in the particle collection also depends on the intended use for the material created. Particles may be sufficiently bonded to one another, or to a substrate, or both, with just enough filler material to prevent the particles from easily scattering. Particles may also be sufficiently bonded to one another, or to a substrate, or both, with filler material filling, or practically filling, the inter-particulate spaces between the particles or between the particles and a substrate, or both. The amount of filler for substantially filling the inter-particulate spaces may depend on the intended use of the material.

Figure 13:
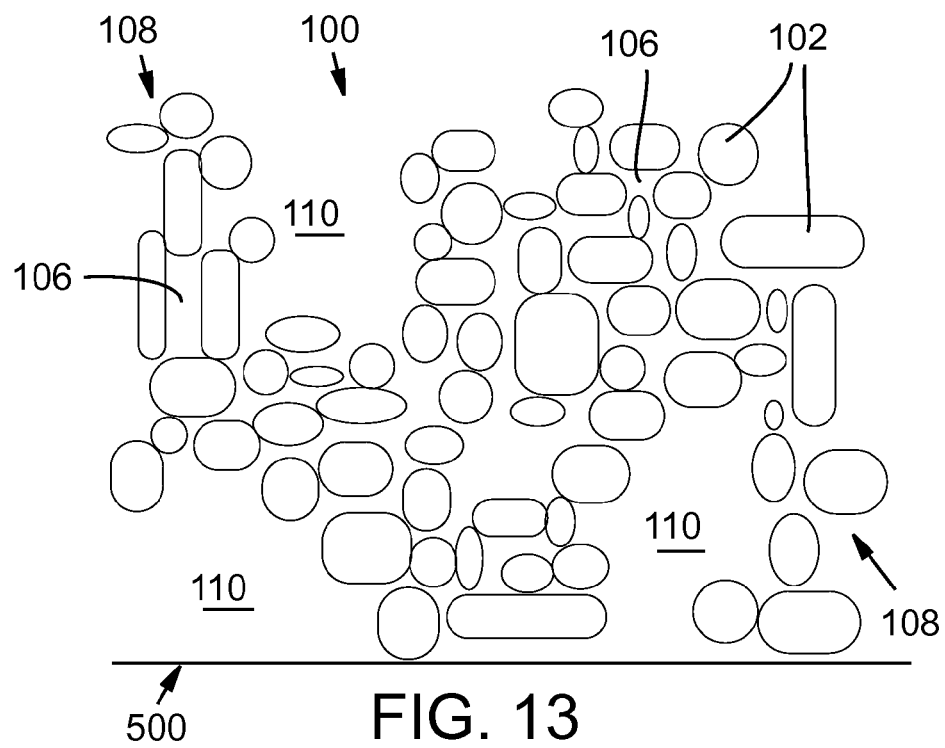
FIG. 13 is a simplified sectional side view drawing of a collection of particles on a substrate.

FIG. 13 illustrates a collection of randomly stacked particles 100 resting on a substrate 500. The collection of particles 100 could be arranged in any number of manners, including, but not limited to, being held on the surface of a liquid, coated, on, attached to, or touching the surface of a complex, or simple, shape, or suspended by a magnetic or other force. The collection of particles 100 may have groups of particles 102 that form agglomerates 108 leaving agglomerate spaces 110 between agglomerates 108. There are also interstitial spaces 106 between particles. Collectively, agglomerate spaces 110 and interstitial spaces 106 are inter-particulate spaces.

The collection of particles 100 also has an outer surface. Generally the outer surface may be considered as the contour of the collection of particles 100, especially for the particles 102 that are not proximate the substrate 500. If the collection of particles 100 is suspended instead of resting on a substrate, the outer surface is generally defined by the particles 102 distal from the interior of the collection of particles 100. The interior may be the center of mass of the collection of particles 100, simply areas where particles 102 are mostly bounded by other particles 102, or a combination of the two. For collections of particles 100 on a substrate 500 or the surface of a liquid, the interior may include the interface between the substrate 500, or liquid surface, and particles 102.

Figure 14:
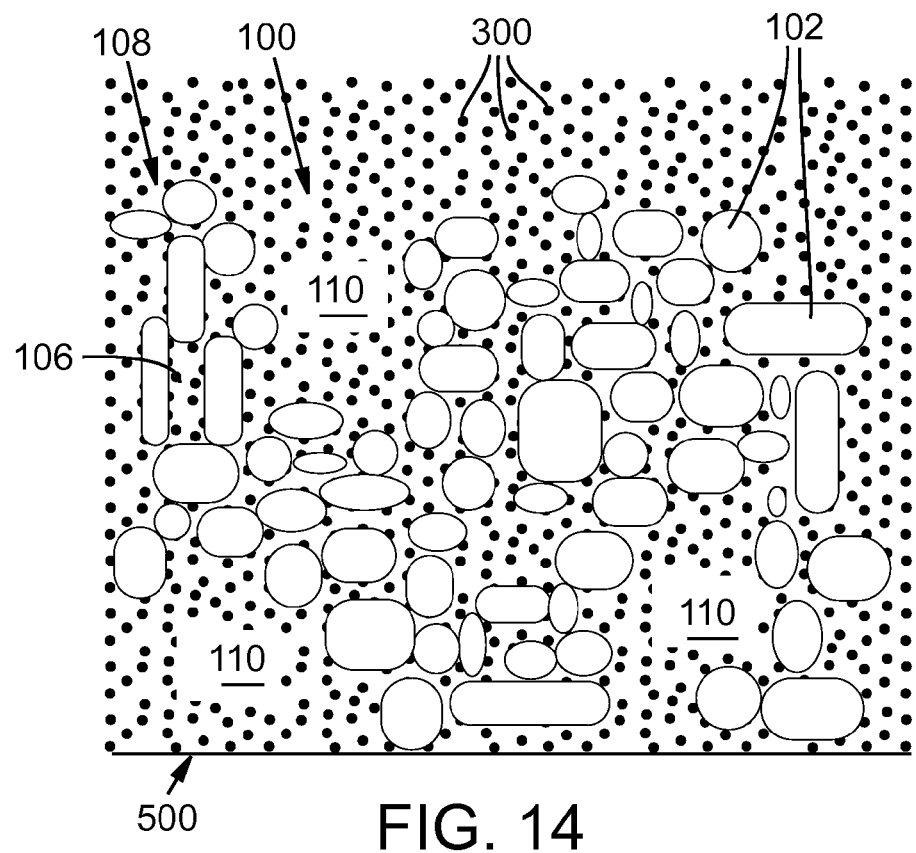
FIG. 14 is a simplified sectional side view of the collection of particles of FIG. 13 with a first precursor introduced to the collection of particles.
Figure 15:
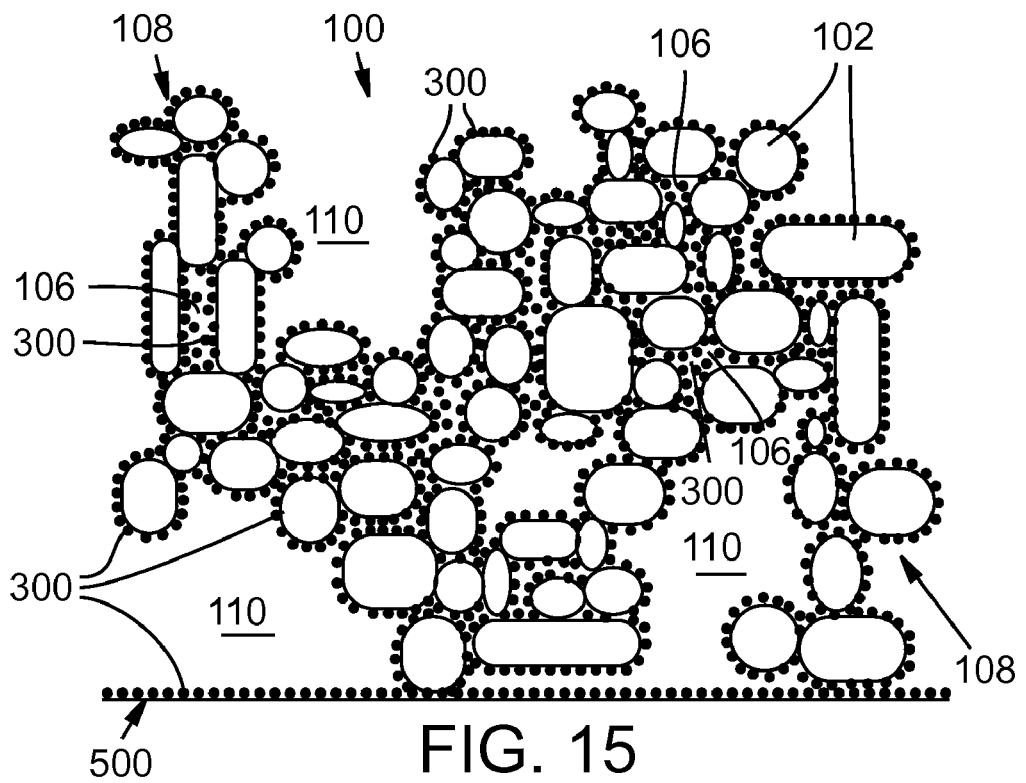
FIG. 15 is a simplified sectional side view of the collection of particles of FIG. 14 depicting adsorbed and free first precursor particles.

Referring now to FIGS. 14 and 15, a first precursor 300 is introduced to the collection of particles 100. For example, the collection of particles 100 may be placed in a reactor, such as those previously discussed, designed for ALD and/or CVD and, after purging the chamber, the first precursor 300 could be introduced into the chamber. The collection of particles 100 is exposed to the first precursor 300 long enough to enter the inter-particulate spaces 110, 106 and to adsorb to the surface of particles 102. In some embodiments, adsorption may not occur along all surfaces of particles 102. Adsorption may also occur at substrate 500.

The first precursor 300 is then purged from the collection of particles 100, or the collection of particles 100 may be moved away from the first precursor 300. However, not all of the first precursor 300 is removed from the collection of particles 100. Adsorbed precursor 300 remains on particles 102 and/or substrate 500 and some free precursor particles 300 remain in inter-particulate spaces 106 and/or 110. In some embodiments, free precursor particles 300 remain in inter-particulate spaces 106, but not in inter-particulate spaces 110. In FIG. 15 the agglomerate spaces 110 do not retain free first precursor particles 300 because there are relatively large pathways communicating the agglomerate spaces 110 with the surface of the collection of particles 100 even though these relatively large pathways are not depicted for all of the agglomerate spaces 110.

Figure 16:
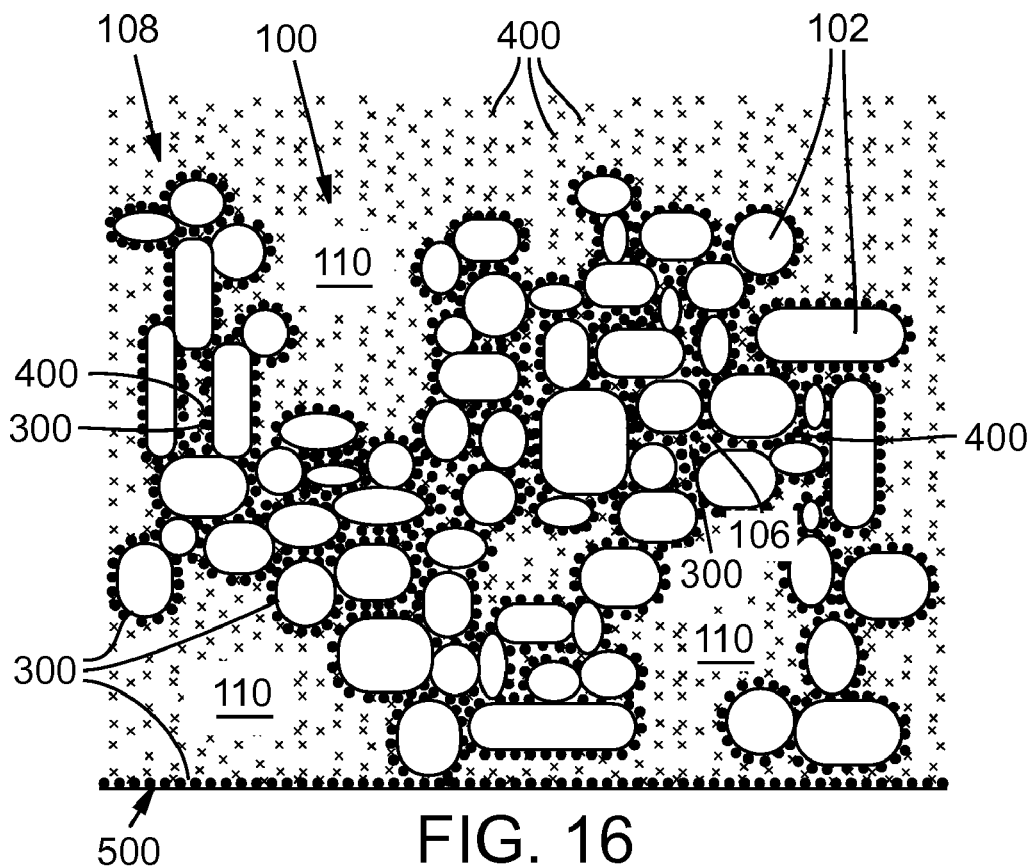
FIG. 16 is a simplified sectional side view of the collection of particles of FIG. 15 depicting a second precursor introduced to the collection of particles.

FIG. 16 depicts a second precursor 400 introduced to the collection of particles 100. The second precursor 400 may be introduced in a manner similar to the first precursor 300. The collection of particles 100 is exposed to the second precursor 400 long enough to enter the inter-particulate spaces 110, 106 and to react with the first precursor 300 remaining on particles 102, substrate 500, and within the collection of particles 100.

Figure 17:
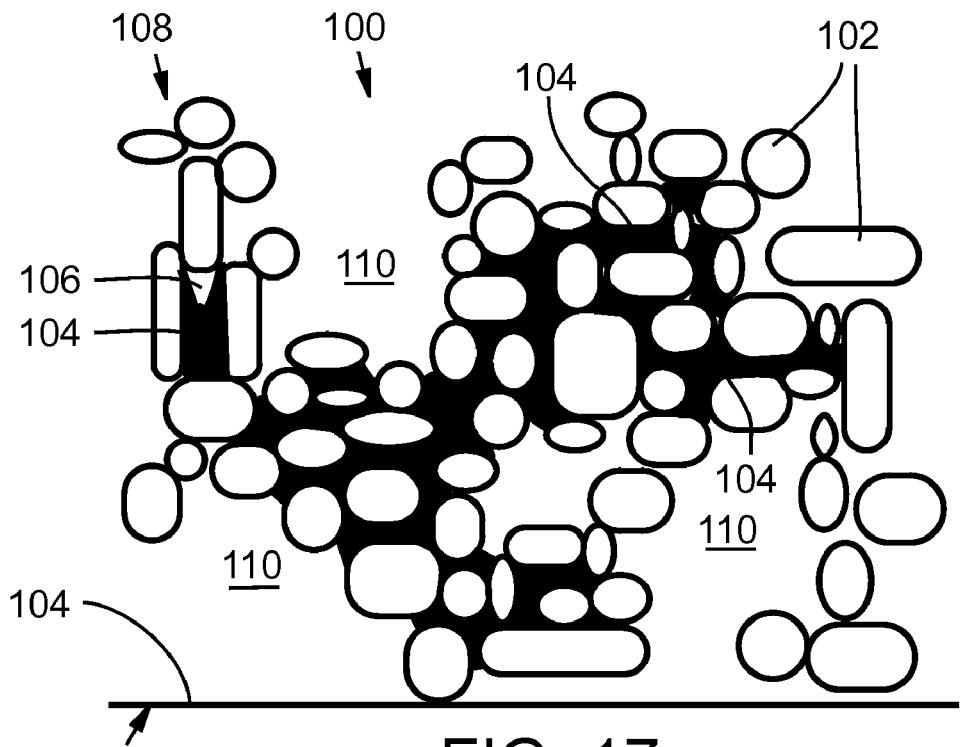
FIG. 17 is a simplified sectional side view of the collection of particles of FIG. 16 depicting a filler material building up in the interior of the collection of particles after the first and second precursor react with one another.

Referring to FIG. 17, the second precursor 400 is purged from the collection of particles 100, or the collection of particles 100 is moved away from the second precursor 400. Filler material 104 has been deposited on particles 102 and on substrate 500. Filler material 104 has also been deposited, or built-up, in inter-particulate spaces 106. In other embodiments, filler material 104 may also build-up in inter-particulate spaces 110. A greater amount of the filler material 104 may build-up within the collection of particles 100 than at the surface due to the free first precursor 300 remaining in the inter-particulate spaces 106 and/or 110.

While building-up filler material 104 has been described as one cycle of a four step process (first precursor 300, purge, second precursor 400, purge) for simplicity, tens, hundreds, thousands of cycles, or more may be used to build-up filler material 104 in the interior of the collection of particles 100.

Even though built-up filler material 104 is illustrated in some inter-particulate spaces 106, 110, filler 104 build-up may occur in more or fewer inter-particulate spaces 106, 110, or both, depending on factors such as the first and second precursor materials 300, 400, purge times, temperatures, the make up of the collection of particles 100, etching cycles, and other factors. These cycles may also build-up more or less filler material 104 on particles 102 and/or substrate 500, but generally not as much as within the inter-particulate spaces 106, 110, or both.

Figure 18:
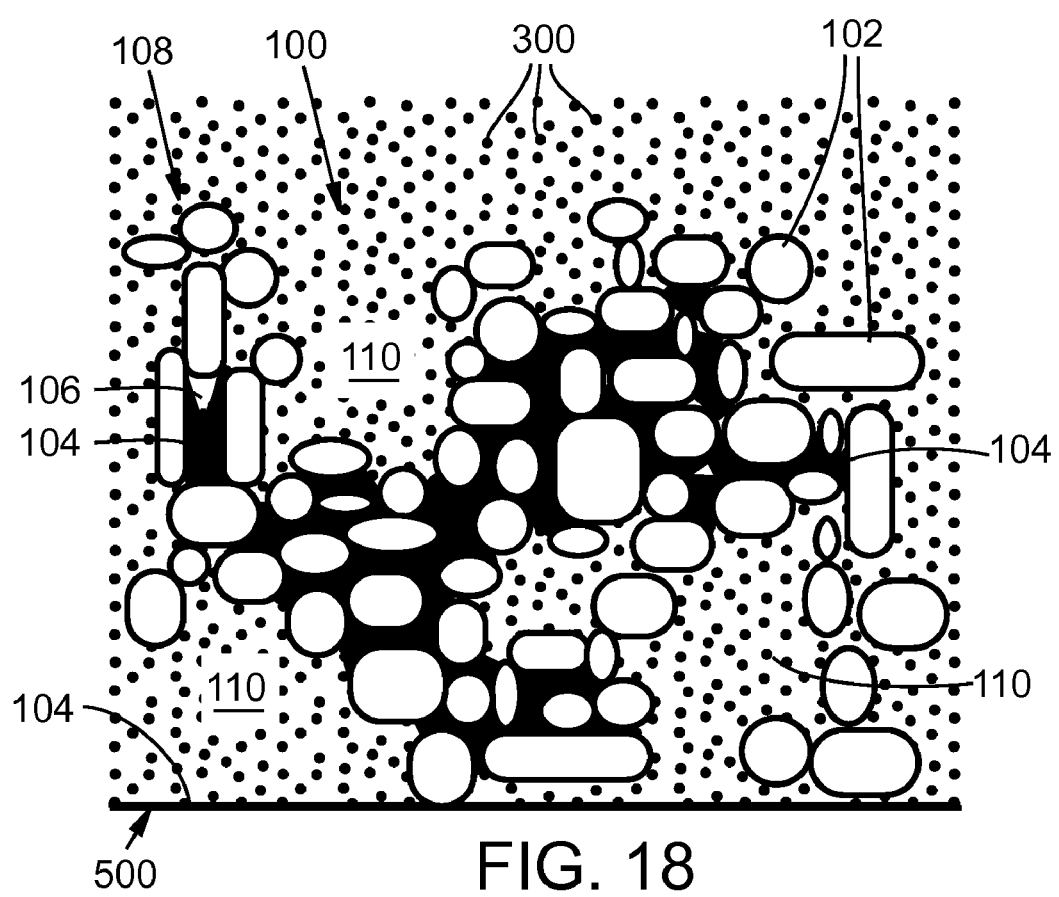
FIG. 18 is a simplified sectional side view of the collection of particles of FIG. 17 depicting with a first precursor introduced to the collection of particles.
Figure 19:
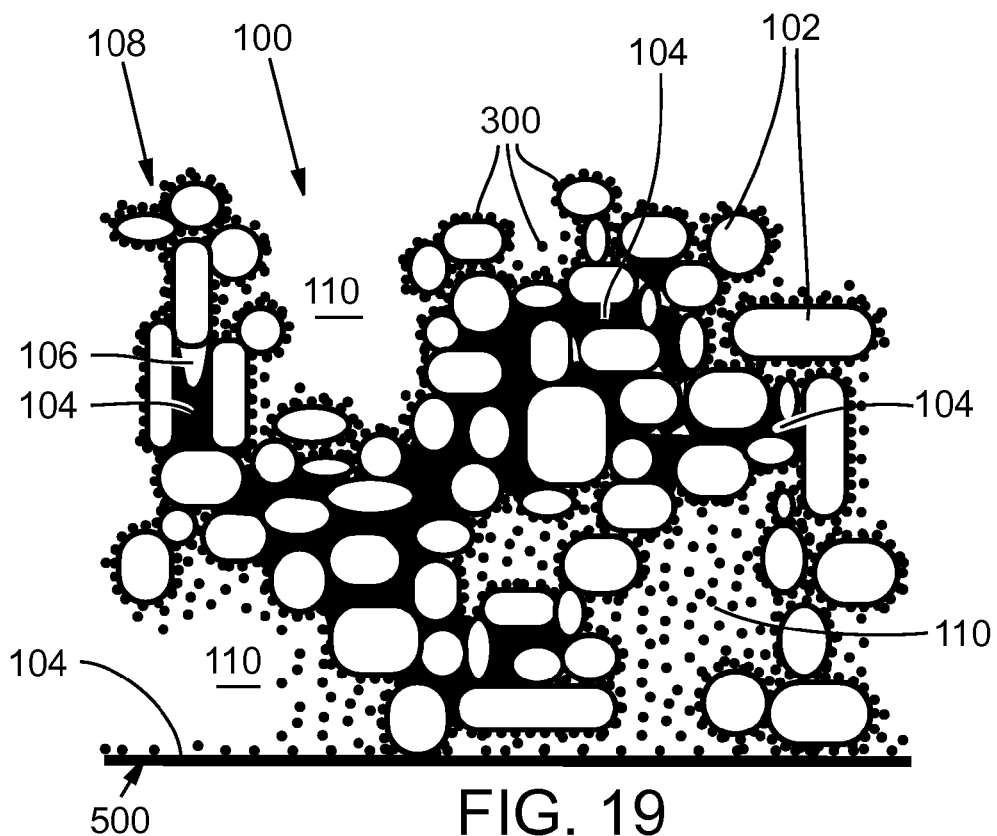
FIG. 19 is a simplified sectional side view of the collection of particles of FIG. 18 depicting adsorbed and free first precursor particles.

Referring now to FIGS. 18 and 19, the first precursor 300 is again introduced to the collection of particles 100 with filler material 104 both on the particles 102 and within at least some of the inter-particulate spaces 106, 110, or both. The collection of particles 100 is exposed to the first precursor 300 long enough to enter the inter-particulate spaces 110, 106 and to adsorb to the surface of filler material 104 on particles 102 and/or on substrate 500. In some embodiments, adsorption may not occur along all surfaces of filler material 104.

The first precursor 300 is then purged from the collection of particles 100, or the collection of particles 100 may be moved away from the first precursor 300. However, not all of the first precursor 300 is removed from the collection of particles 100. Adsorbed precursor 300 remains on filler material 104 and some free (not adsorbed) precursor particles 300 remain in inter-particulate spaces 106 and/or 110. By reducing the purge time, for example, a greater concentration of free first precursor particles 300 may remain substantially in the collection of particles 100 for the second cycle, including inter-particulate spaces 110 and/or 106 that have relatively large pathways leading to them from the surface of the collection of particles.

As with the description of the first cycle, the second cycle is described as one cycle for illustrative purposes, but continuing to build-up filler material 104 from the interior of the collection of particles 100 towards the surface of the collection of particles 100 may occur over tens, hundreds, thousands of cycles, or more. For example, the jump in the amount of filler material 104 deposited between FIG. 19 and FIG. 21 may require 500, 1000 or more cycles. Depending on the arrangement of the particles 102, composition of the particles 102, the first and second precursors 300 and 400 as well as other factors, other embodiments may use fewer cycles to deposit filler material 104.

Figure 20:
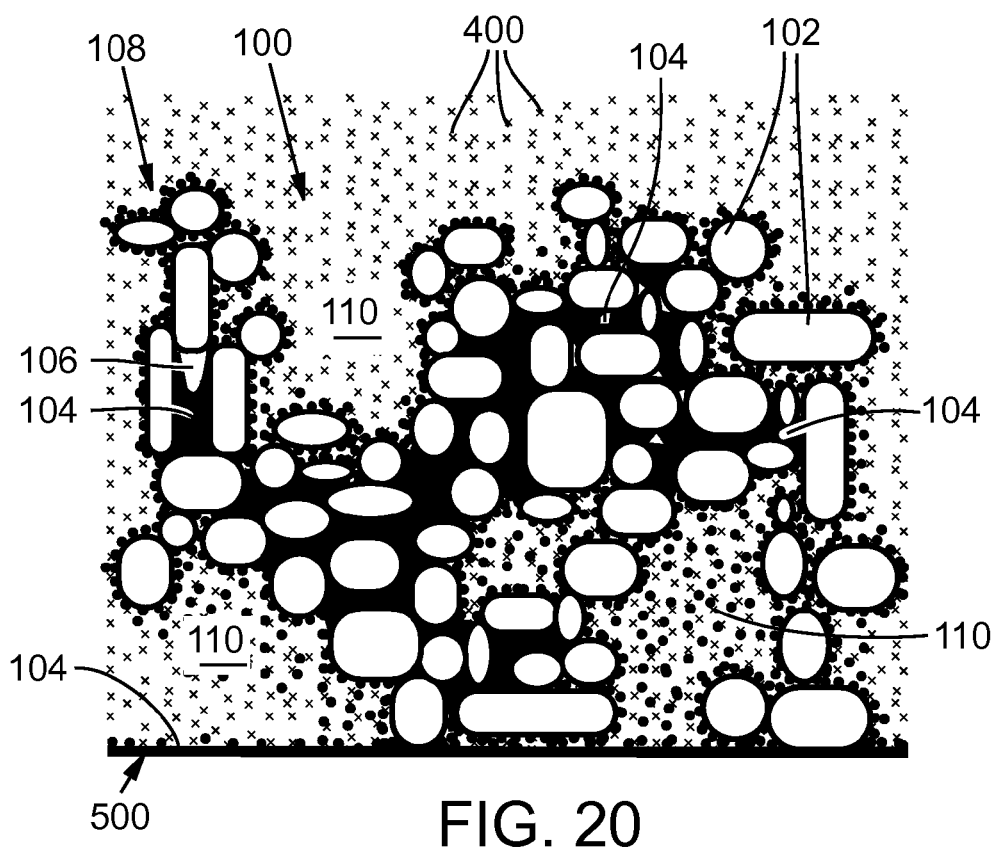
FIG. 20 is a simplified sectional side view of the collection of particles of FIG. 19 depicting a second precursor introduced to the collection of particles.

FIG. 20 depicts the second precursor 400 re-introduced to the collection of particles 100. The collection of particles 100 is exposed to the second precursor 400 long enough to enter the inter-particulate spaces 110, 106 and to react with the first precursor 300 remaining on filler material 104 and within the collection of particles 100.

Figure 21:
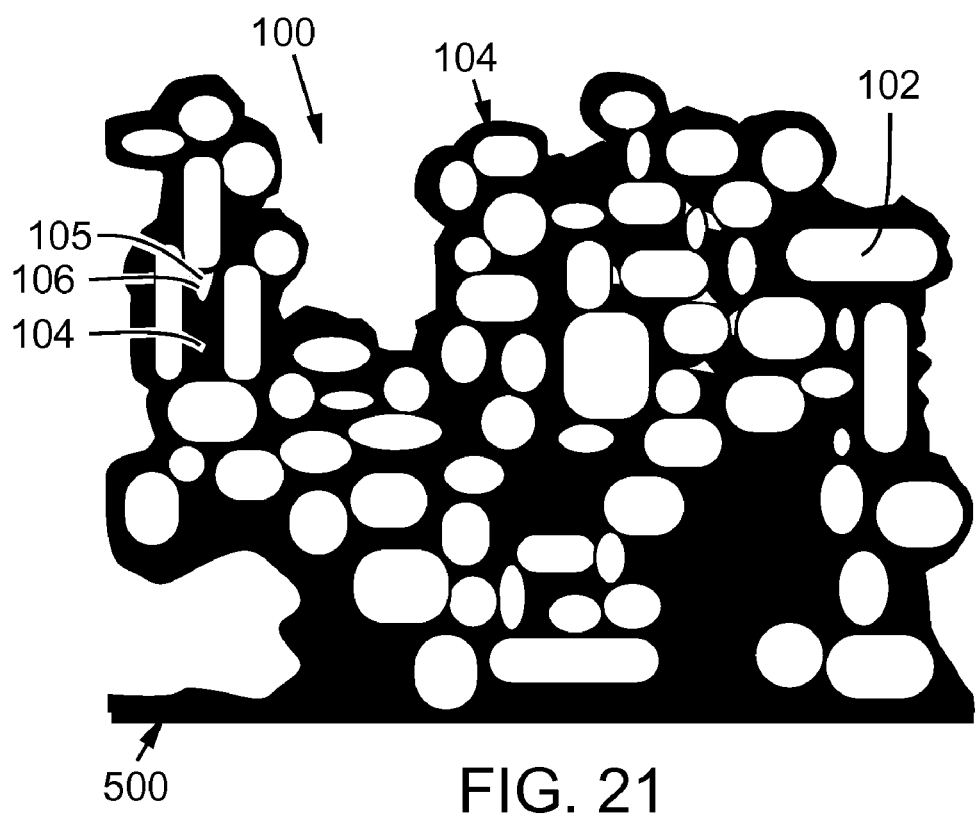
FIG. 21 is a simplified sectional side view of the collection of particles of FIG. 20 depicting the filler material continuing to build up in the interior of the collection of particles towards the surface of the collection of particles after the first and second precursor react with one another.

At the end of the second cycle, FIG. 21 depicts the inter-particulate spaces 106, 110 being substantially filled with filler material 104. Note that substantially filled includes degrees of build-up by filler material 104 that may be dependent upon the desired characteristics of the material being created. Build-up may range from completely filling all of the inter-particulates spaces 106, 110 to just having enough filler material 104 to hold particles 102 together and/or to the substrate 500. One example of substantially filled, depicted in FIG. 21, includes small voids 105, however, the filler material 104 substantially fills the inter-particulate spaces with fewer or more voids. The voids may be intentionally or unintentionally created.

Filler material 104 may build-up past the surface of the collection of particles 100, and may show influences from the surface of the collection of particles 100. In some embodiments, filler material 104 may not build-up past the surface of the collection of particles 100. Depending on the desired material properties, some embodiments may stop processing at this point. Other embodiments may continue to build-up a thicker layer of the filler material 104 around the outer surface of the collection of particles 100 as illustrated in FIG. 22.

Figure 22:
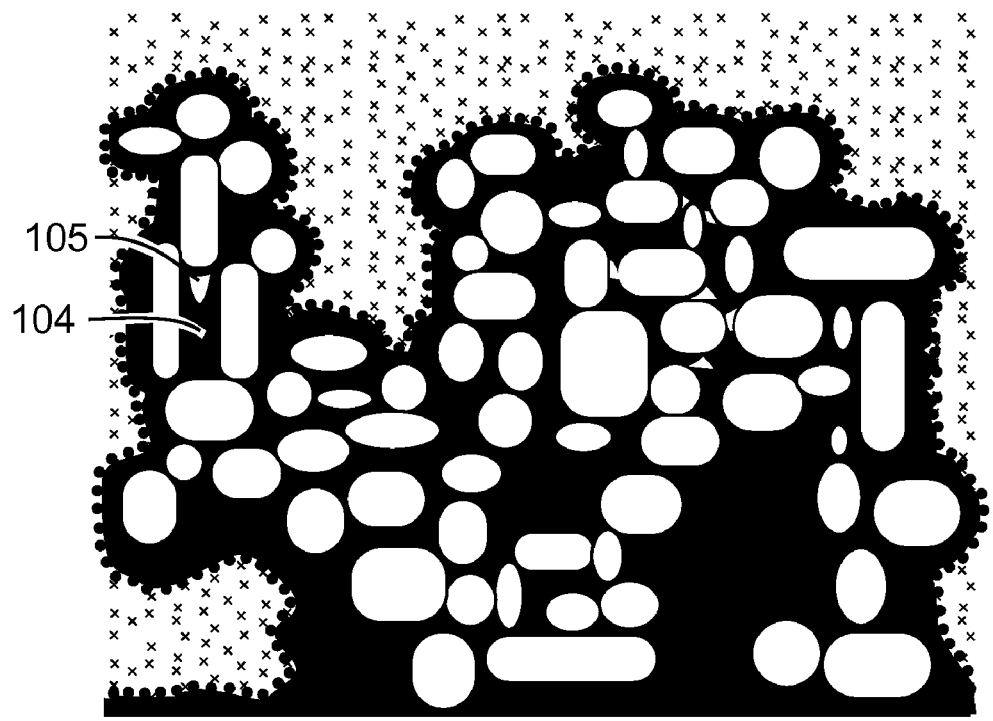
FIG. 22 is a simplified sectional side view of the collection of particles of FIG. 21 depicting adsorbed and free first precursor particles and a second precursor introduced to the collection of particles.

Referring now to FIG. 22, the first precursor 300 is again introduced to the collection of particles 100 having filler material 104 on the particles 102 and within many of the inter-particulate spaces 106, 110. The collection of particles 100 is exposed to the first precursor 300 long enough to adsorb to the surface of filler material 104. In some embodiments, adsorption may not occur along all surfaces of filler material 104.

The first precursor 300 is then purged from the collection of particles 100, or the collection of particles 100 may be moved away from the first precursor 300. Adsorbed precursor 300 remains on filler material 104. In some embodiments free (not adsorbed) precursor particles 300 may remain in the low points or depressions along the surface of filler material 104 (not illustrated). The second precursor 400 is re-introduced to the collection of particles 100. The collection of particles 100 is exposed to the second precursor 400 long enough to react with the first precursor 300 remaining on filler material 104. Like the first and second cycles, the third cycle may be carried out over tens, hundreds, thousands of cycles, or more. Again, depending on the desired material properties, some embodiments may stop at this point. Other embodiments may include a smooth cap of filler material 104, for example, illustrated in FIG. 23.

Figure 23:
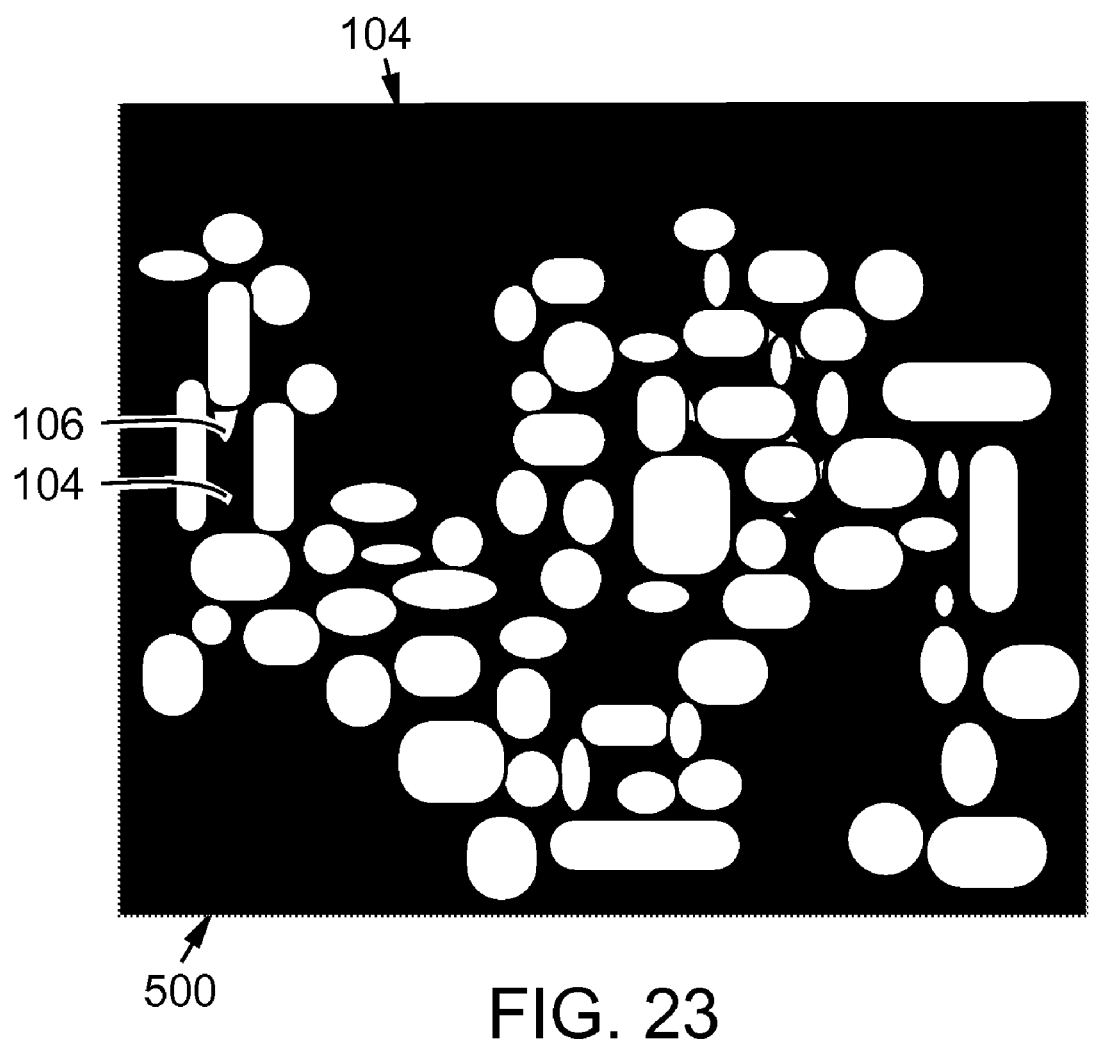
FIG. 23 is a simplified sectional side view of the collection of particles of FIG. 22 depicting a smooth cap of filler material built-up over the collection of particles after the first and second precursor react with one another.

FIG. 23 depicts the collection of particles 100 having a smooth cap over the collection of particles 100. A smooth cap may be provided by building up the filler material 104 on the outer surface of the collection of particles 100, then performing a chemical/mechanical polishing procedure. Other manners for providing a smooth cap may also be used. While FIG. 23 depicts a smooth cap on three sides of the collection of particles 100, a smooth cap may be provided on only one side, or on any number of sides. Providing a smooth cap may not be needed for some embodiments, and other embodiments may use conventional ALD cycles to provide a pinhole-free layer of filler material 104 near or beyond the surface of the collection of particles 100 either with or without providing a smooth cap.

Examples of composite materials made by the modified-ALD process of the present disclosure will now be described.

EXAMPLE 1

Opaque White Wear-Resistant Coating

White abrasion-resistant coatings are desirable in dental applications, for instance, to prevent allergic reactions to the Ni component of stainless steel in crowns. In this application, even 100 Å roughness is only marginally acceptable.

The particles used in this example were $TiO_2$ particles that comprise the white pigment in commercial spray paint. Paint was applied to glass, steel, and silicon substrates with adequate thickness to conceal the substrate. After the paint dried, samples were baked in an air furnace at 400° C.-500° C. to remove all traces of organic binder and any carbon surface residue, leaving behind the $TiO_2$ pigment of the paint—a white powder comprised of 0.2-0.3 micron (um) sized $TiO_2$ particles, stacked 10-30 microns thick on the surface of the substrate. This resulting powder was loosely bound and could easily be brushed or wiped off with a light touch, but was robust enough to survive a light air or nitrogen blow-off and routine handling which did not involve direct contact with the powder surface. With $TiO_2$ powder in place on the surface of a substrate, alumina ($Al_2O_3$) filler matrix material was deposited in a Planar Systems traveling-wave ALD reactor using a series of pulse/purge/pulse/purge cycles, during which the substrate temperature was held constant at 250° C., nitrogen carrier gas ($N_2$) at 1.5 liters/minute flow rate, and vacuum pressure maintained at 0.5 Torr. The first precursor introduced was Trimethyl Aluminum (TMA) and the second precursor was water, both at room temperature, according to the following process recipe, described below:

| # Cycles | TMA pulse (seconds) | Purge Time (seconds) | Water pulse (seconds) | Purge Time (seconds) |
|----------|---------------------|----------------------|------------------------|----------------------|
| 100      | 20                  | 20                   | 10                     | 10                   |
| 900      | 10                  | 2                    | 5                      | 5                    |
| 9000     | 6                   | 4                    | 2                      | 4                    |

In this particular example, TMA was pulsed for 20 sec, and then purged for 20 sec, followed by a 10 sec water pulse and 10 sec purge. This cycle was repeated 100 times. Next, 900 cycles of 10 second TMA pulse/2 second $N_2$ purge/5 second water pulse/5 second $N_2$ purge were performed. Finally, 9000 cycles of 6 second TMA pulse/4 second $N_2$ purge/2 second water pulse/4 second purge were performed. The large number of repeat cycles ensures that the particles are sufficiently bonded to the substrate, each other, and the filler matrix. In the last two steps (900 and 9000 cycles, respectively), the disparity in TMA pulse and purge times is believed to leave behind a substantial amount of residual TMA in the inter-particulate spaces, resulting in an "inside-out" fill. The first two steps fill inter-particulate spaces and the last provides a smoothing cap.

Resulting film properties on steel, silicon and glass substrates were characterized using various techniques. For instance, adhesion tests using adhesive tape and visual observations made with an optical microscope indicate a very high degree of adhesion to the substrate.

The resulting composite films were optically-scattering and opaque, resembling the original white paint used to deposit the particles. However, being a composite, the new opaque white films were robust to scratching with a hand-held diamond scribe, and adhered firmly to glass, silicon, and stainless steel with no detectable delamination occurring after a tape pull test. Films of this kind were successfully applied to stainless steel blanks for pediatric dental crowns. The resulting coating was bendable to a 0.25-0.5 inch radius of curvature without cracking.

EXAMPLE 2

Abrasion Resistant Composite Coating

A second set of samples used a commercially available diamond powder for the particles in a composite film suitable for use as an abrasion-resistant coating. Diamond powder is commercially available as a polishing media from Abrasive Technologies Corporation of Lewis Center, Ohio. Samples of composite materials with various diamond particle sizes from 0.25-3.0 microns each embedded in a matrix of alumina, were made.

To create the diamond particle stack, the diamond powder was mixed with deionized water and dispensed onto sample substrates in various ways, including using a dropper then heating to evaporate the water, leaving only a stacked powder 10-30 microns thick, on the surface of the substrate. In some samples, the diamond powder was mixed into a commercial spray lacquer, such as those available from Valspar, and applied by spraying, or with an air brush. Similar to the white paint in the first example, the air-brushed sample was baked at 400° C.-500° C. to drive off the binder and carbon contamination, leaving a stacked arrangement of diamond particles. The diamond particle stack was infiltrated with alumina in the same reaction chamber with the $TiO_2$ pigment particle samples of Example 1 (using the same process recipe set forth in the above table), producing a composite film.

The resulting diamond-alumina composite film survived the abrasion resistance test, remaining intact after 600 abrasion cycles, with no damage to glass or silicon substrates. Abrasion resistance was tested with a Linear Taber Abraser model 5750 and H18 CALIBRADE™ abradent. The abrasion resistance of the sample composites exceeded the abrasion resistance of diamond-like coating (DLC) films used as a control sample. After 600 abraser cycles, the DLC film in the path of the abrader was completely removed, while the same amount of abrasion of the composite samples merely smoothed the surface and removed about 0.5 micron of composite film. Using diamond particles with harder matrix materials, such as titanium nitride (TiN), tantalum carbide (TaC), and other nitrides and carbides would be expected to provide even better abrasion resistance than alumina-diamond composites.

While certain embodiments are described herein as involving purging the reaction space with an inert gas, the terms "purging" and "purge" are intended to be construed broadly, to include not only flushing of the reaction space such as by introduction of a flow of an inert gas or other material, but also more generally to include the removal or cleansing of excess chemicals and reaction byproducts. For example, excess chemicals and reaction byproducts may be removed by pumping the reaction space and/or by lowering the pressure within the reaction space. Consistent with the definition of the term "purge," the removal of excess non-adsorbed chemicals from the reaction space need not be perfectly effective, but will typically involve leaving surface-bound chemicals and possibly some insignificant amount of non-surface-bound chemicals or residual matter within the reaction space. Moreover, when a purge gas is used to remove chemicals from the reaction space, various inert and non-inert purge gases may be used. Preferred purge gases include nitrogen ($N_2$), helium (He), neon (Ne), argon (Ar), carbon dioxide ($CO_2$), and mixtures thereof, but others may also be used, depending on the deposition reaction chemistry involved. A constant flow of one or more inert gases may also be used to transport precursor chemicals into the reaction space and/or to adjust the pressure within the reaction space.

Furthermore, while embodiments using a modified ALD and/or quasi-CVD method have been discussed with reference to the figures, other embodiments for forming thin films of composite material may involve conventional ALD or conventional CVD. Other embodiments may combine conventional ALD, conventional CVD, and a modified ALD and/or quasi-CVD method in any combination, or may use subcombinations of these processes.

It will be obvious to those having skill in the art that many changes may be made to the details of the above-described embodiments without departing from the underlying principles of the invention. The scope of the present invention should, therefore, be determined only by the following claims.

The invention claimed is:

1. A method of producing a composite film, comprising:
   (a) placing a cluster of particles into a reaction space, the cluster defining inter-particulate spaces in fluid communication with the reaction space;
   (b) introducing a first precursor chemical into the reaction space so that the first precursor chemical infiltrates the inter-particulate spaces and adsorbs to surfaces of the particles bordering the inter-particulate spaces;
   (c) after step (b), purging the reaction space until excess non-adsorbed amounts of the first precursor chemical are substantially removed from the reaction space, but non-adsorbed residual amounts of the first precursor chemical remain within the inter-particulate spaces;
   (d) after step (c), introducing a second precursor chemical into the reaction space, wherein the second precursor chemical infiltrates the inter-particulate spaces and reacts with the first precursor chemical, including reacting with the non-adsorbed residual first precursor chemical, to form a deposit of filler material on the surfaces of the particles and in the inter-particulate spaces;
   (e) removing excess amounts of the second precursor chemical from the reaction space; and
   (f) repeating the steps (b) through (e) until the particles are embedded in the filler material.

2. The method of claim 1, wherein:
   step (f) further comprises repeating steps (b) through (e) until the inter-particulate spaces are substantially filled with the desired filler material.

3. The method of claim 1, wherein the cluster includes a layer of particles stacked on the surface of a supporting material.

4. The method of claim 3, wherein the supporting material is a solid substrate having an irregular, three-dimensional surface.

5. The method of claim 1, wherein the cluster is suspended in the reaction space.

6. A method of producing a composite film, comprising:
   (a) placing a cluster of particles into a reaction space, the cluster defining inter-particulate spaces in fluid communication with the reaction space;
   (b) introducing a first precursor chemical into the reaction space so that the first precursor chemical infiltrates the inter-particulate spaces and adsorbs to surfaces of the particles bordering the inter-particulate spaces;
   (c) purging the reaction space until excess non-adsorbed amounts of the first precursor chemical are substantially removed from the reaction space;
   (d) introducing a second precursor chemical into the reaction space, wherein the second precursor chemical infiltrates the inter-particulate spaces and reacts with the first precursor chemical to form a deposit of filler material on the surfaces of the particles;
   (e) removing excess amounts of the second precursor chemical from the reaction space;
   (f) etching at least a portion of accumulated filler matrix material preferentially from an outer surface of the cluster of particles and from inlets to at least some of the inter-particulate spaces without removing substantial portions of the particles; and
   (g) repeating the steps (b) through (e) until the particles are embedded in the filler material, and repeating the step (f) at least one additional time during repeating the steps (b) through (e).

7. The method of claim 6, wherein the etching is performed by any one of the first precursor chemical, the second precursor chemical, a combination of residual first and second precursor chemicals, and a chemical etchant.

8. The method of claim 6, wherein the etching includes introducing into the reaction space a chemical etchant different from the first and second precursor chemicals.

9. The method of claim 6, wherein the etching step includes periodically etching during the step (b).

10. The method of claim 6, wherein:
   step (c) further comprises leaving non-adsorbed residual amounts of the first precursor chemical within the inter-particulate spaces;
   step (d) further comprises the second precursor chemical reacting with the non-adsorbed residual first precursor chemical to form a deposit of filler material in the inter-particulate spaces; and
   step (g) further comprises repeating steps (b) through (e) until the inter-particulate spaces are substantially filled with the desired filler material.

11. The method of claim 6, wherein the etching step includes periodically etching during the step (d).

* * * * *